(12) United States Patent
Maejima et al.

(10) Patent No.: US 7,518,921 B2
(45) Date of Patent: Apr. 14, 2009

(54) SEMICONDUCTOR MEMORY DEVICE WHICH INCLUDES MEMORY CELL HAVING CHARGE ACCUMULATION LAYER AND CONTROL GATE

(75) Inventors: Hiroshi Maejima, Milpitas, CA (US); Makoto Hamada, Mountain View, CA (US)

(73) Assignee: Kabushiki Kaish Toshiba, Tokyo (JP)

( * ) Notice: Subject to any disclaimer, the term of this patent is extended or adjusted under 35 U.S.C. 154(b) by 55 days.

(21) Appl. No.: 11/688,481

(22) Filed: Mar. 20, 2007

(65) Prior Publication Data

US 2008/0232183 A1    Sep. 25, 2008

(51) Int. Cl.
G11C 16/04 (2006.01)
(52) U.S. Cl. .............................. 365/185.17; 365/185.23
(58) Field of Classification Search ............ 365/185.17, 365/185.23, 185.27
See application file for complete search history.

(56) References Cited

U.S. PATENT DOCUMENTS

2005/0083744 A1* 4/2005 Arai et al. ................... 365/202
2005/0243628 A1* 11/2005 Kasai et al. .................. 365/222
2006/0083066 A1* 4/2006 Hasegawa et al. ...... 365/185.18
2008/0074925 A1* 3/2008 Ogura et al. ........... 365/185.09

FOREIGN PATENT DOCUMENTS

JP    2005-142431    6/2005

* cited by examiner

*Primary Examiner*—Vu A Le
(74) *Attorney, Agent, or Firm*—Oblon, Spivak, McClelland, Maier & Neustadt, P.C.

(57) ABSTRACT

A semiconductor memory device includes a memory cell array, a word line, a source line, a row decoder, and a source line driver circuit. The memory cell array includes a memory cell unit having a plurality of memory cells connected in series. The word line is connected to control gates of the memory cells. The source line is electrically connected to sources of the memory cells positioned on one end sides of the memory cell unit. The row decoder selects the word line. The source line driver circuit is arranged in the row decoder and applies a first voltage to the source line.

30 Claims, 18 Drawing Sheets

SEMICONDUCTOR MEMORY DEVICE WHICH INCLUDES MEMORY CELL HAVING CHARGE ACCUMULATION LAYER AND CONTROL GATE

BACKGROUND OF THE INVENTION

1. Field of the Invention

The present invention relates to a semiconductor memory device. The invention relates to, for example, a semiconductor memory device which includes a memory cell having a charge accumulation layer and a control gate.

2. Description of the Related Art

Up to this time, an electrically erasable and programmable ROM (EEPROM) has been known as a nonvolatile semiconductor memory capable of electrically rewriting data therein. A NAND-type flash memory has been known as an EEPROM in which a large capacity and high integration can be attained.

Recently, the NAND-type flash memory has been required to accelerate its operation. For instance, Jpn. Pat. Appln. KOKAI Publication No. 2005-142431 has disclosed a configuration which lowers the resistance of a source line in order to accelerate an operation of reading data. According to this configuration, the NAND-type flash memory may enlarge the wiring width of a region to which currents are collected in the source line, and it results in lowering the resistance of the source line.

However, it is hard for the NAND-type flash memory of such a configuration to improve, for instance, the drive ability of a source line driver. The NAND-type flash memory of such a configuration may not fully reduce the resistance of the source line sometimes.

BRIEF SUMMARY OF THE INVENTION

A semiconductor memory device according to an aspect of the present invention includes:

memory cell units in which a plurality of memory cells are connected in series, the memory cells including a charge accumulation layer and a control gate formed on the charge accumulation layer;

a memory cell array in which the memory cell units are disposed;

a word line which is connected to the control gates of the memory cells;

a bit line which is electrically connected to drains of the memory cells positioned on one end sides of the memory cell units;

a source line which is electrically connected to sources of the memory cells positioned on the other end sides of the memory cell units;

a sense amplifier which amplifies data read from the memory cell onto the bit line;

a row decoder which selects the word line; and a source line driver circuit which is arranged in the row decoder and applies a first voltage to the source line.

DETAILED DESCRIPTION OF THE INVENTION

First Embodiment

Figure 1:
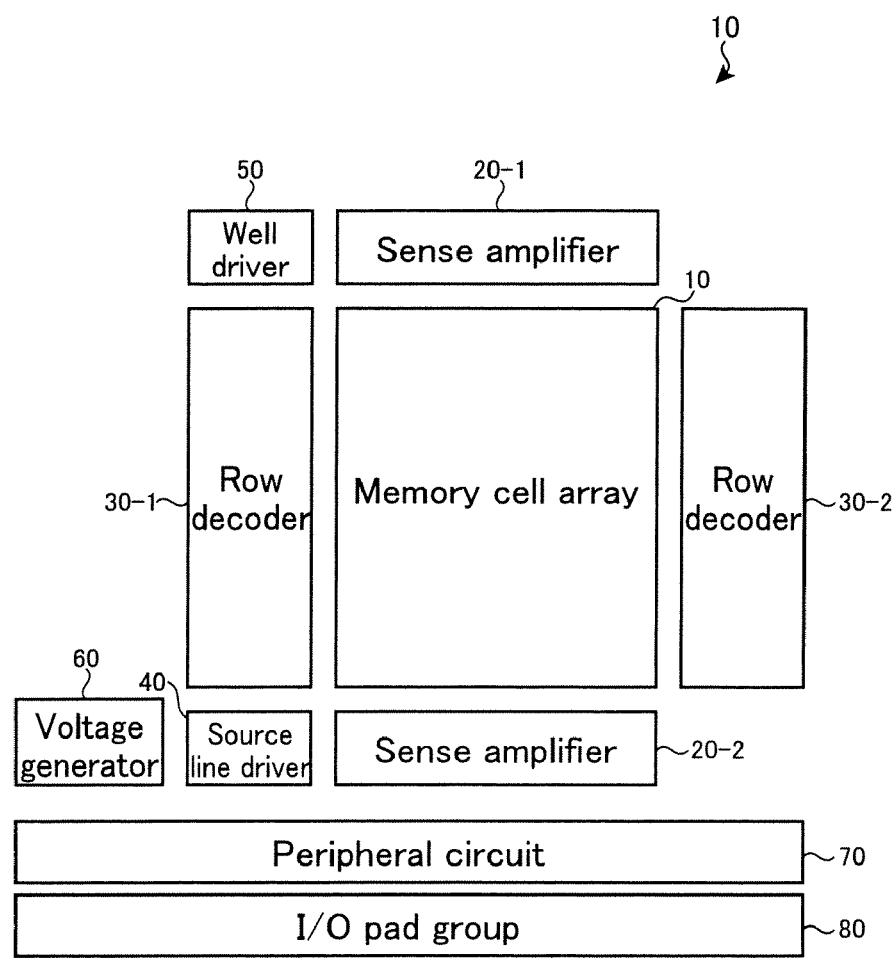
FIG. 1 is a block diagram of a flash memory according to a first embodiment of the invention.

A semiconductor memory device according to a first embodiment of the invention will be described. FIG. 1 is a block diagram of a NAND-type flash memory according to the first embodiment.

The NAND-type flash memory 10 includes, as shown in FIG. 1, a memory cell array 10, sense amplifiers 20-1 and 20-2, row decoders 30-1 and 30-2, and a source line driver 40, a well driver 50, a voltage generator 60, a peripheral circuit 70, and an input/output (I/O) pad group 80. Hereinafter, the sense amplifiers 20-1 and 20-2 are simply referred to as a sense amplifier 20 when they are not discriminated particularly from each other. The row decoders 30-1 and 30-2 are simply referred to as a row decoder 30 when they are not distinguished particularly from each other.

The memory cell array 10 includes a plurality of memory cell units in which nonvolatile memory cells are connected in series. Word lines are connected to gates of each memory cell. Bit lines are connected to drains of memory cells on one end sides of the memory cell units. Source line is connected to sources of memory cells on other sides of the memory cell units. The sense amplifier 20 senses and amplifies the data read onto the bit lines from the memory cells. The row decoder 30 selects a row direction of the memory cell array 10. That is, the row decoder 30 selects the word line. The source line driver 40 applies a voltage to the source line. The well driver 50 applies a voltage to a well region on which the memory cell array 10 is formed. The voltage generation circuit 60 generates a variety of types of voltages. The peripheral circuit 70 includes a control circuit to control the foregoing circuit blocks 20 to 50, and an input/output buffer, etc. The input/output pad group 80 includes a plurality of input/output pads connectable with the outside. The memory cell array 10 then sends and receives a voltage and a variety of kinds of signals to and from the outside.

Figure 2:
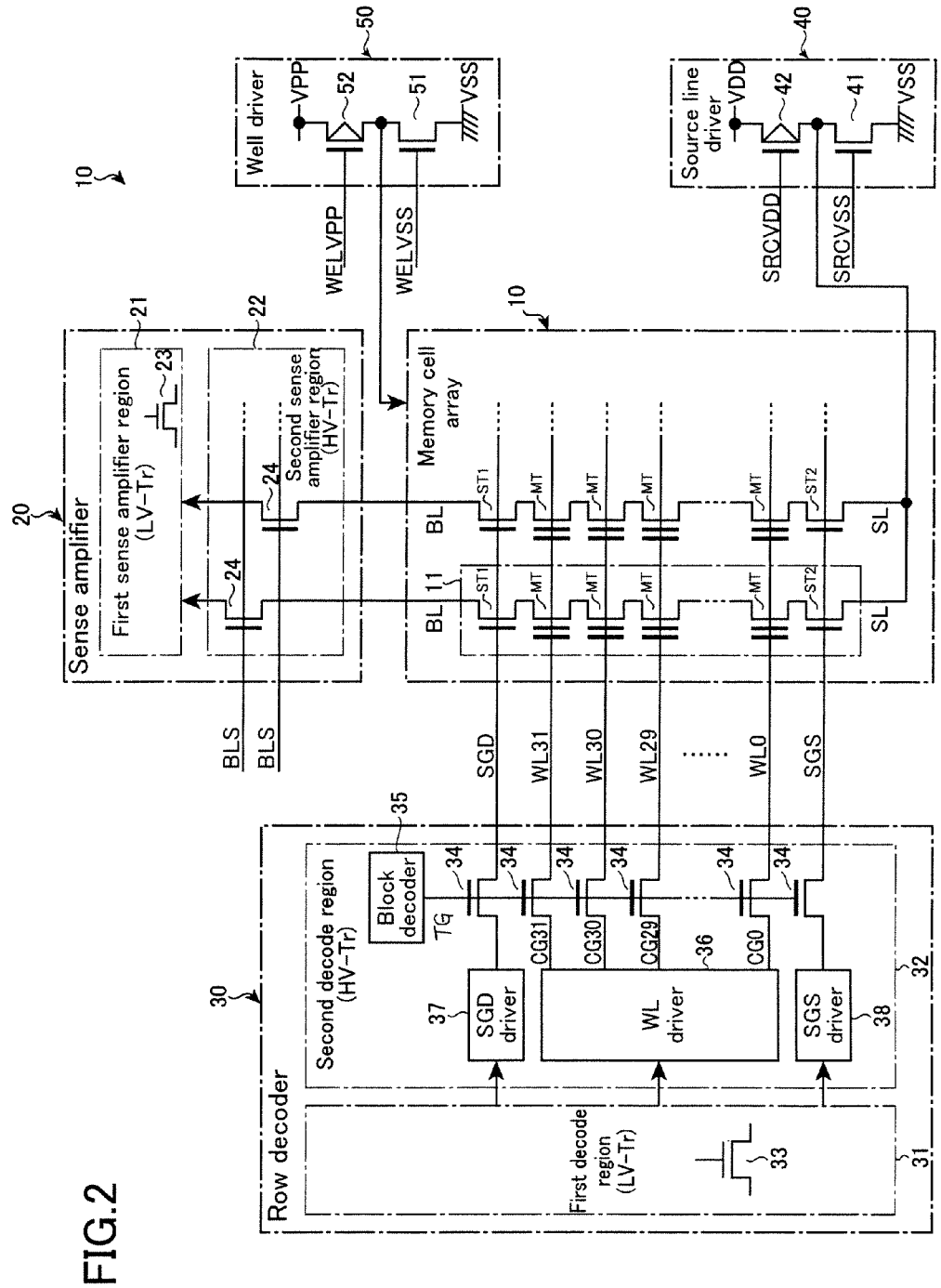
FIG. 2 is a circuit diagram of the flash memory according to the first embodiment of the invention.

Next to this, the configurations of the circuit blocks 10 to 50 given above will be described in detail with reference to FIG. 2. FIG. 2 depicts a circuit diagram of the memory cell array 10, the sense amplifier 20, the row decoder 30, the source line driver 40, and the well driver 50.

At first, the memory array 10 will be described. The memory cell array 10 has, as mentioned above, a plurality of memory cell units 11. Each of the memory cell unit 11 includes, for example, 32 memory cell transistors MT, and select transistors ST1 and ST2. Each memory cell transistor MT has a stacked gate structure having a charge accumulation layer (e.g., floating gate) formed on a semiconductor substrate with a gate insulating film interposed therebetween, and a control gate electrode formed on the floating gate with an inter-gate insulating film interposed therebetween. The number of memory cell transistors MT is not limited to 32, and the number may be 8, 16, 64, 128, 256, etc., so that the transistors MT are not limited in number. The adjacent memory cell transistors MTs share the source or the drain with each other. The memory cell transistors MTs are arranged between the select transistors ST1 and ST2 so that their current paths are connected in series. The drain region of the one end side and the source region of the other end side of the memory cell transistors MTs connected in series are connected to the source region of the select transistor ST1 and to the drain region of the select transistor ST2, respectively.

The control gate electrodes of the memory cell transistors MTs in a same row are commonly connected to any one of word lines WL0 to WL31, the gates of the select transistors ST1 and ST2 of the memory cells in a same row are commonly connected to select gate lines SGD and SGS, respectively. To simplify the description, the word lines WL0 to WL31 are simply referred to as word line WL hereinafter sometimes. The drains of the select transistors ST1s in a same column in the memory cell array 10 are commonly connected to any one of bit lines BL. The sources of the select transistors ST2 are commonly connected to the source lines SL. It is not always needed for both select transistors ST1 and ST2 to be provided, and if the memory cell units 11 can be selected, only either of them may be provided for this semiconductor memory device.

FIG. 2 illustrates only the memory cell unit 11 positioned on one row. However, plural memory cell units 11 on a plurality of rows may be disposed inside the memory cell array 10. In this case, the memory cell units 11 on a same column are connected to the same bit line BL. Data is written into a plurality of memory cell transistors MTs connected to the identical word line WL, at a time, and this writing unit is referred to as a page. Further, a plurality of memory cell units 11 on the same row erase the data therein, at a time, and this erasing unit is called memory block.

Next, the configuration of the sense amplifier 20 will be described by referring to FIG. 2. The sense amplifier 20 includes, as depicted in figure, a first sense amplifier region 21 and a second sense amplifier region 22. The first sense amplifier region 21 is a low voltage region which is formed by including a MOS transistor 23 to be operated at a first voltage (e.g., VDD=1.5 V). In contrast, the second sense amplifier region 22 is a high voltage region which is formed by including a MOS transistor 24 to be operated at a second voltage higher than the first voltage.

The second sense amplifier region 22 includes a plurality of MOS transistors 24. The MOS transistors 24 are, of cause, transistors which have high withstand voltages higher than that of the MOS transistor 23 in the first sense amplifier 21. One ends of the current paths of the MOS transistors 24 are connected to any one of bit lines BL, and the other ends thereof are connected to the first sense amplifier region 21, respectively. The gates of the MOS transistors 24 are connected to the bit line selection lines BLS, respectively. Upon reading the data, the selection of any one of the bit line selection lines BLS turns on the MOS transistors 24 connected to the selected selection line BLS. The data read onto the bit lines BL are fed to the first sense amplifier region 21 through the MOS transistor 24 which has been brought into an on state. The data is sensed and amplified in the first sense amplifier region 21.

The configuration of the row decoder 30 will be described hereinafter. The row decoder 30 includes, as depicted in figure, a first decode region 31 and a second decode region 32. The configuration of the row decoder 30 may utilize the configuration disclosed, for instance, by Jpn. Pat. Appln. KOKAI Publication No. 2002-63795. The first decode region 31 is a low voltage region which is formed by including the MOS transistor 33 to operate at the first voltage. On the other hand, the second decode region 32 is a high voltage region which is formed by including the MOS transistors to operate at the third voltage (e.g., VPP=20 V) higher than the first voltage.

The second decode region 32 includes transfer gate transistors 34, a block decoder 35, a word line driver 36, and select line drivers 37 and 38.

The transfer gate transistors 34 are MOS transistors which have withstand voltages higher than that of the MOS transistor 33 in the first decode region 31. The transfer gate transistors 34 are disposed for each word line WL and select gate line SGD, and SGS, and one ends of the current paths are connected to the corresponding word line WL, and the select gate lines SGD and SGS. The other ends of the transfer gate transistors 34, the one ends of which are connected to the word lines WL, are connected to a word line driver 36 through control gate lines CG0 to CG31. Hereinafter, when the control gate lines CG0 to CG31 are not distinguished particularly from one another, they are simply referred to as a control gate CG. The other ends of the transfer gate transistors 34, the one ends of which are connected to the select gate lines SGD and SGS, are connected to select gate line drivers 37 and 38, respectively. The gates of the transfer gate transistors 34, which are connected to the select gate lines SGD and SGS, and to the word line WL connected to the select transistors ST1 and ST2, and to memory cell transistors MTs in the same memory block cell, are connected to the same control line TG.

The block decoder 35 selects the control line TG to which the transfer gate transistors 34 corresponding to the memory cell unit 11 including a selected memory cell are connected, and turns on the transfer gate transistor 34.

The word line driver 36 selects any one of word line WL in response to addresses given from the first decode region 31.

The word line driver 36 then applies a voltage to the selected word line WL through the control gate line CG and the current path of the transfer gate transistor 34.

The select gate line drivers 37 and 38 apply voltages to the select gate lines SGD and SGS in response to the addresses given from the first decode region 31 through the current paths of the transfer gate transistors 34, respectively.

Next to this, the configuration of a source line driver 40 will be described. The source line driver 40 includes an n-channel MOS transistor 41 and a p-channel MOS transistor 42. A voltage VSS (e.g., 0 V) is applied to the source of the MOS transistor 41, the drain thereof is connected to source lines SL, and a signal SRCVSS is input to its gate. A voltage VDD is applied to the source of the MOS transistor 42, its drain is connected to the source lines SL, and a signal SRCVDD is input to its gate.

Upon reading the data, the signal SRCVSS is made high, thereby the voltages of the source lines SL are set to 0 V.

The configuration of the well driver 50 will be described hereinafter. The well driver 50 includes an n-channel MOS transistor 51 and a p-channel MOS transistor 52. A voltage VSS (e.g., 0 V) is applied to the source of the MOS transistor 51, its drain is connected to a well region on which the memory cell array is formed, and a signal WELVSS is input to its gate. A voltage VPP is applied to the source of the MOS transistor 52, its drain is connected a well region on which the memory cell array 10 is formed, a signal WELVPP is input to its gate.

On reading and writing in the data, the signal WELVSS is made high, thereby the voltage in the well region is set to 0 V. In contrast, on erasing the data, the signal WELVPP is made high, thereby the voltage of the well region is set to VPP (e.g., 20 V). The voltage VPP is generated from the voltage generator 60.

Figure 3:
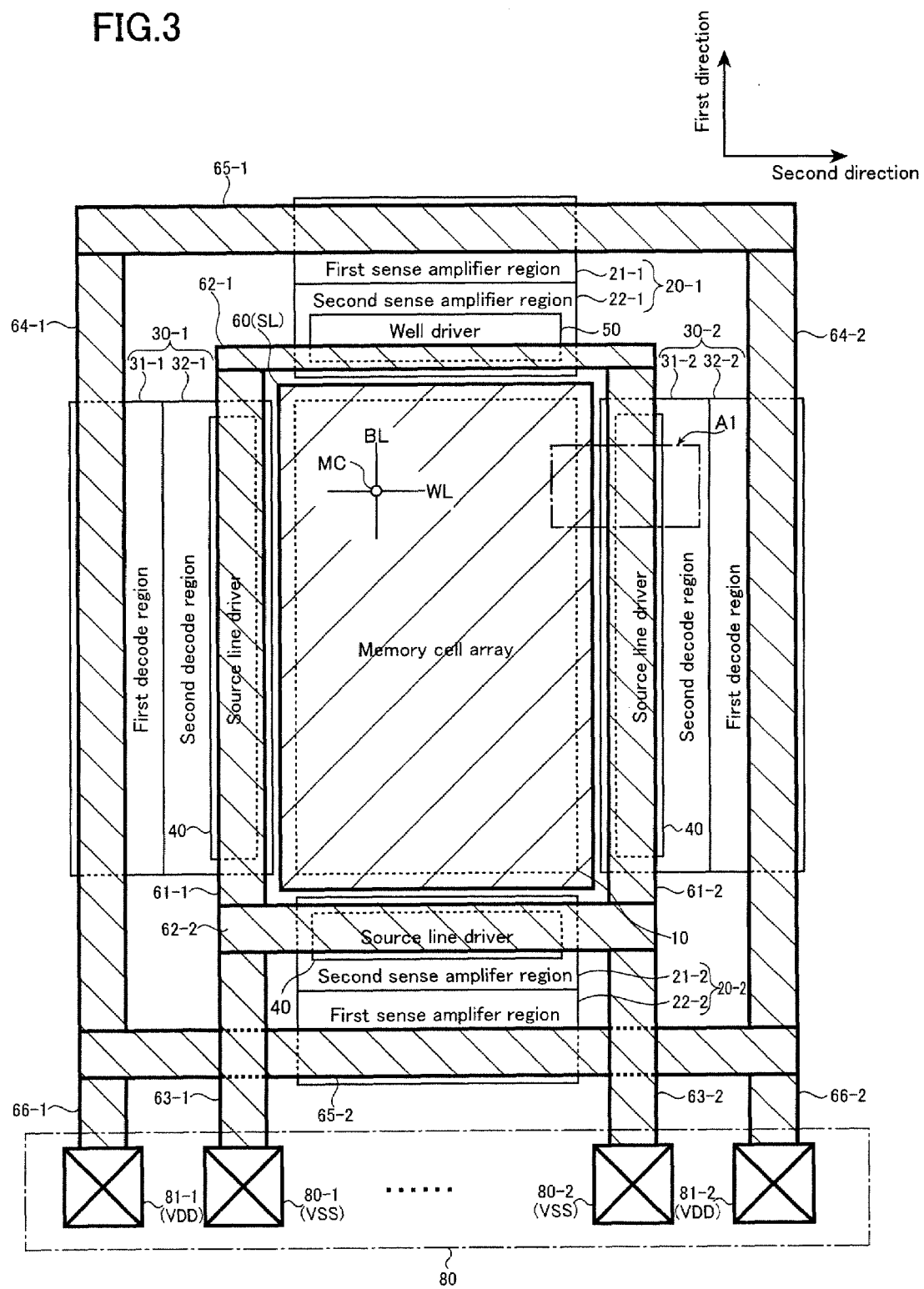
FIG. 3 is a plane view of the flash memory according to the first embodiment of the invention.

Referring now to FIG. 3, a plane arrangement of the memory cell array 10, the sense amplifier 20, the row decoder 30, the source line driver 40, the well driver 50, and the input/output pad group 80 will be set forth. FIG. 3 illustrates a plane view of the NAND-type flash memory 1 according to the first embodiment, and also illustrates a pattern of a metal wiring layer. In the figure, the shaded portions show the metal wiring layers.

Hereinafter, if it is needed to distinguish the first and the second sense amplifiers 21 and 22 in the sense amplifiers 20-1 and 20-2, respectively, they are called first sense amplifier regions 21-1 and 21-2, and second sense amplifier regions 22-1 and 22-2, respectively. If it is needed to distinguish the first and the second decode regions 31 and 32 in the row decoder 30-1 and 30-2, they are called first decode regions 31-1 and 31-2, and second decode regions 32-1 and 32-2, respectively.

In the memory cell array 10, as shown in figure, the bit line BL is disposed along a first direction, and the word line WL is disposed in a second direction perpendicular to the first direction.

The sense amplifiers 20-1 and 20-2 are arranged so as to be adjacent to the memory cell array 10 in the first direction. The sense amplifiers 20-1 and 20-2 are disposed so as to sandwich the memory cell array 10 in the first direction.

The second sense amplifier region 22-1 in the sense amplifier 20-1 is disposed closer to the memory cell array 10 in comparison to the first sense amplifier region 21-1. That is, the second sense amplifier region 22-1 is disposed so as to be sandwiched by the first sense amplifier region 21-1 and the memory cell array 10 along the first direction.

The second sense amplifier region 22-2 in the sense amplifier 20-1 is arranged closer to the memory array 10 in comparison with the first sense amplifier region 21-2. That is, the second sense amplifier region 22-2 is arranged so as to be sandwiched by the first sense amplifier region 21-2 and the memory cell array 10 along the first direction.

The row decoders 30-1 and 30-2 are disposed so as to be adjacent to the memory array 10 in the second direction. The row decoders 30-1 and 30-2 are disposed so as to sandwich the memory cell array 10 in the second direction.

The second decode region 32-1 in the row decoder 30-1 is disposed closer to the memory array 10 in comparison to the first decode region 31-1. The second decode region 32-1, namely, disposed so as to be sandwiched between the first decode region 31-1 and the memory cell array 10 along with the second direction.

The second decode region 32-2 in the row decoder 30-2 is disposed closer to the memory array 10 in comparison to the first decode region 31-2. The second decode region 32-2, namely, disposed so as to be sandwiched between the first decode region 31-2 and the memory cell array 10 along with the second direction.

The input/output pad group 80 is arranged adjacently to the sense amplifier 20-2 along the first direction. The input/output pad group 80 and the memory cell array 10 are arranged in a manner to sandwich the sense amplifier 20-2. A plurality of pads are arranged along the second direction in the input/output pad group 80.

The well driver 50 takes its position inside the second sense amplifier region 22-1 of the sense amplifier 20-1. The well driver 50 is, namely arranged so as to be held between the first sense amplifier region 21-1 and the memory cell array 10 along the first direction.

The source line driver 40 is disposed inside the second sense amplifier region 22-2, inside the second decode region 32-1, and inside the second decode region 32-2. The source line driver 40 positioned inside the second decode region 32-1 is, therefore, disposed in a manner to be sandwiched by the first decode region 31-1 and the memory cell array 10 along the second direction. The source line driver 40 disposed inside the second decode region 32-2 is arranged so as to be held between the first decode region 31-2 and the memory cell array 10 along the second direction. Further, the source line driver 40 disposed inside the second sense amplifier region 22-2 is arranged so as to be sandwiched by the first sense amplifier region 21-2 and the memory cell array 10 along the first direction. In other words, the source line driver 40 is disposed within a high voltage region in the row decoders 30-1 and 30-2, and the sense amplifier 20-2. The high voltage region may accommodate only the MOS transistor 41 out of the source line driver 40. The MOS transistor 42, therefore, may be disposed in other region, for example, in a peripheral circuit unit. Both MOS transistors 41 and 42, of course, may be positioned in the sense amplifier 20 and the row decoder 30.

At the upper part of the memory cell array 10, the metal wiring layer 30 functioning as the source line SL is formed while covering the upper face of the memory array 10.

Metal wiring layers 61-1 and 61-2 configured as stripes along the first direction are formed at the upper parts of the second decode regions 32-1 and 32-2. The metal wiring layers 61-1 and 61-2 function as VSS wiring to apply the voltage VSS to the source line driver 40 in the second decoding areas 32-1 and 32-2, respectively.

Further, metal wiring layers 62-1 and 62-2 configured as stripes along the second direction are formed at the upper parts of the second sense amplifier regions 22-1 and 22-2. The metal wiring layers 62-1 and 62-2 function as VSS wiring to apply the voltage VSS to the well driver 50 in the second sense amplifier region 22-1 and the source line driver 40 in the second sense amplifier region 22-2, respectively.

The metal wiring layers 61-1, 61-2, 62-1, and 62-2 are connected to one another so as to surround the source line SL. The metal wiring layers 61-1, 61-2, 62-1, and 62-2 are connected to pads 80-1 and 80-2 in the input/output pad group 80 through metal wiring layers 63-1 and 63-2. The voltage VSS is externally applied to the pads 80-1 and 80-2. The current flowing in the well driver 50 is smaller than the current flowing in the source line driver 40. Accordingly, the wiring width of the metal wiring layer 62-1 may be made narrower than the wiring widths of the metal wiring layers 61-1, 61-2, 62-2, 63-1, and 63-2.

Metal wiring layers 64-1 and 64-2 configured as stripes along the first direction are formed at the upper parts of the first decode regions 31-1 and 31-2. The metal wiring layers 64-1 and 64-2 function as VDD wiring to apply the voltage VDD to the first decode region 31-1 and 31-2, respectively.

At the upper parts of the first sense amplifier regions 21-1 and 21-2, further, metal wiring layers 65-1 and 65-2 configured as stripes along the second direction are formed. The metal wiring layers 65-1 and 65-2 function as VDD wiring to apply the voltage VDD to the first sense amplifier regions 21-1 and 21-2, respectively.

The metal wiring layers 64-1, 64-2, 65-1, and 65-2 are connected to one another so as to surround the VSS wiring. The metal wiring layers 64-1, 64-2, 65-1, and 65-2 are connected to the pads 81-1 and 81-2 in the input/output pad group 80 through metal wiring layers 66-1 and 66-2. The voltage VDD is externally applied to the pads 81-1 and 81-2.

Figure 4:
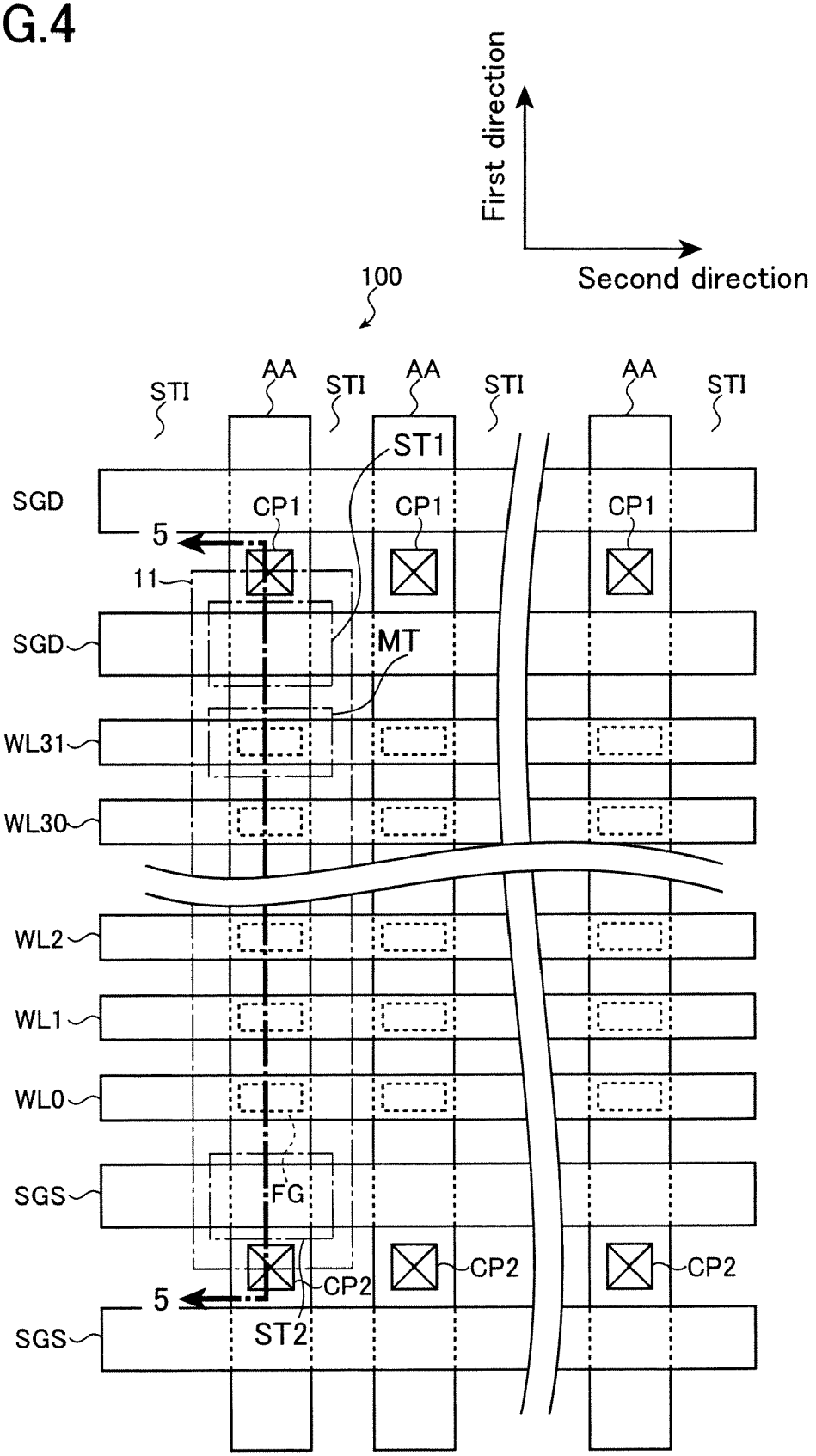
FIG. 4 is a plane view of a memory cell array provided in the flash memory according to the flash memory according to the first embodiment of the invention.

The plane configuration of the memory cell array configured as mentioned above will be described hereinafter referring FIG. 4. FIG. 4 is a plane view of a part of the region of the memory cell array 10. As illustrated in figure, a plurality of element regions AA configured as stripes along the first direction are disposed in a semiconductor substrate (p-type substrate) 100 along the second direction perpendicular to the first direction. Element isolation regions STI are formed between the adjacent element regions AA, the element regions AA are electrically isolated by the element isolation regions STI. On the semiconductor substrate 100, word lines WL and select gate lines SGD and SGS configured as stripes along the second direction are formed so as to span the plurality of element regions AA. Floating gates FG are provided in the regions in which the word lines WL and the element regions AA intersect with one another. The memory cell transistors MTs are disposed in the region in which the words lines WL and the element regions AA intersect with one another, and the select transistors ST1 and ST2 are provided in the regions to intersect the select gate lines SGDs and SGSs with the element regions AA, respectively. Impurity diffusion layers to be source regions or drain regions of the memory cell transistors MTs and the select transistors ST1 and ST2 are formed in the element regions AA between the word lines WL, between the select gate lines, and between the word line WL and the select gate line, which are adjacent to each other in the first direction.

The impurity diffusion layer, which is formed in the element regions AA between the adjacent select gate lines SGDs in the first direction, function as the drain region of the select transistor ST1. Contact plugs CP1 are formed on the drain regions. The contact plugs CP1 are connected to strip-shaped bit lines BL (not shown) disposed along the first direction. The impurity diffusion layers formed in the element regions AA between the select gate lines SGS adjacent to each other in the first direction function as the source regions of the select transistors ST2. Contac plugs CP2 are formed on the source regions. The contact plugs CP2 are connected to source lines (not shown).

Figure 5:
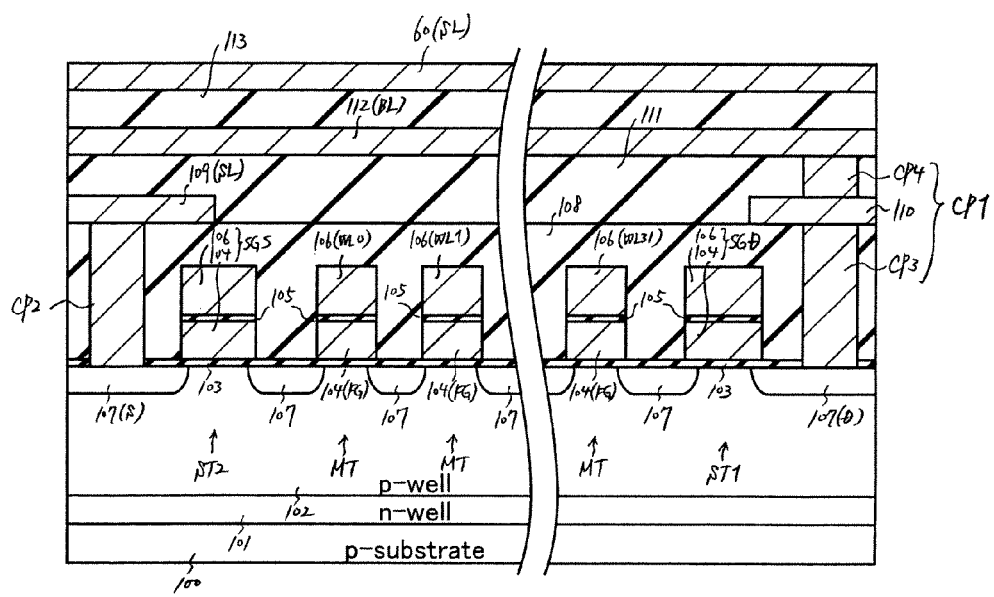
FIG. 5 is a cross-sectional view along a line 5-5 in FIG. 4.

Next, the cross-sectional configuration of the above-configured memory cell unit 11 will be described by referring to FIG. 5. FIG. 5 depicts a cross-sectional view along the bit line direction (first direction) of the memory cell unit 11, and it depicts a cross-sectional view along the line 5-5 of FIG. 4.

As shown in FIG. 5, an n-type well region 101 is formed within a surface region of a p-type semiconductor substrate 100, and a p-type well region 102 is formed in a surface region of the n-type well region 101. A gate insulating film 103 is formed on the p-type well region 102, and gate electrodes of the memory cell transistors MTs, and select transistors ST1 and ST2 are formed on the gate insulating film 103. The gate electrodes of the memory cell transistors MTs, and the select transistors ST1 and ST2 have polycrystalline silicon layers 104 formed on the gate insulating film 103, inter-gate insulating films 105 formed on the polycrystalline silicon layers 104, and polycrystalline silicon layers 106 formed on the inter-gate insulating films 105. The inter-gate insulating film 105 is formed of, for instance, silicon oxide film, or ON film that is a laminated structure of the silicon oxide film and a silicon nitride film, NO film, ONO film, or a laminated structure including those films, or a laminated structure of $YiO_2$, $HfO_2$, $AL2O_3$, $HfALO_x$ or HfALSi film and the silicon oxide film or the silicon nitride film. The gate insulating film 103 functions as a tunnel insulating film.

In the memory cell transistors MTs, the polycrystalline silicon layers 104 function as floating gates (FG). On the other hand, the polycrystalline silicon layers 106 are commonly connected to each other adjacent in the directions orthogonal to the bit lines, and functions as control gate electrodes (word lines WL). In the select transistors ST1 and ST2, the polycrystalline silicon layers 104 and 106 are commonly connected to ones adjacent to each other in the direction of the word line. The polycrystalline silicon layers 104 and 106 function as the select gate lines SGS and SGD. Only the polycrystalline silicon layer 104 may function as a select gate line. In such a case, the electric potentials of the polycrystalline silicon layers 106 of the select transistors ST1 and ST2 are brought into a fixed electric potential or into a state of floating. $N^+$-type impurity diffusion layers 107 are formed on the surface of the semiconductor substrate 100 positioned between the gate electrodes. Each impurity diffusion layer 107 is shared with an adjacent transistor, and functions as a source (S) or a drain (D). Each of the region between an adjacent source and a drain functions as a channel region to become an electron moving region. The gate electrode, the impurity diffusion layer 107, and the channel region form MOS transistor forms the memory cell transistor MT, and the select transistors ST1 and ST2.

An inter-layer insulating film 108 is formed on the semiconductor substrate 100 so as to cover the memory cell transistors MT, and select transistors ST1 and ST2. The contact plug CP2 which reaches the impurity diffusion layer (source) 107 of the select transistor ST2 on the source side is formed in the inter-layer insulating film 108. A metal wiring layer 109 connected to the contact plug CP2 is formed on the inter-layer insulating film 108. The metal wiring layer 109 functions as a part of the source line SL. A contact plug CP3 which reaches the impurity diffusion layer (drain) 107 of the select transistor ST1 on the drain side is formed in the inter-layer wiring layer 108. A metal wiring layer 110 connected to the contact plug CP3 is formed on the inter-layer insulating film 108.

An inter-layer insulating film 111 is formed so as to cover the metal wiring layers 109 and 110 on the inter-layer insulating film 108. A contact plug CP4 reaching the metal wiring layer 110 is formed in the inter-layer insulating film 111. A metal wiring layer 112 commonly connected to a plurality of contact plugs CP4 is formed on the inter-layer insulating film 111. The metal wiring layer 112 functions as the bit line BL. The contact pugs CP3 and CP4, and the metal wiring layer 110 correspond to the contact plug CP1 in FIG. 4.

An inter-layer insulating film 113 is formed so as to cover the metal wiring layer 112 on the inter-layer insulating film 111. A metal wiring layer 60 covering the upper part of the memory cell unit 11 is formed on the metal wiring layer 113. The metal wiring layer 60 functions as the source line SL as described for FIG. 3. The metal wiring layer 60 is then connected to the metal wiring layer 109 in a not shown region.

Figure 6:
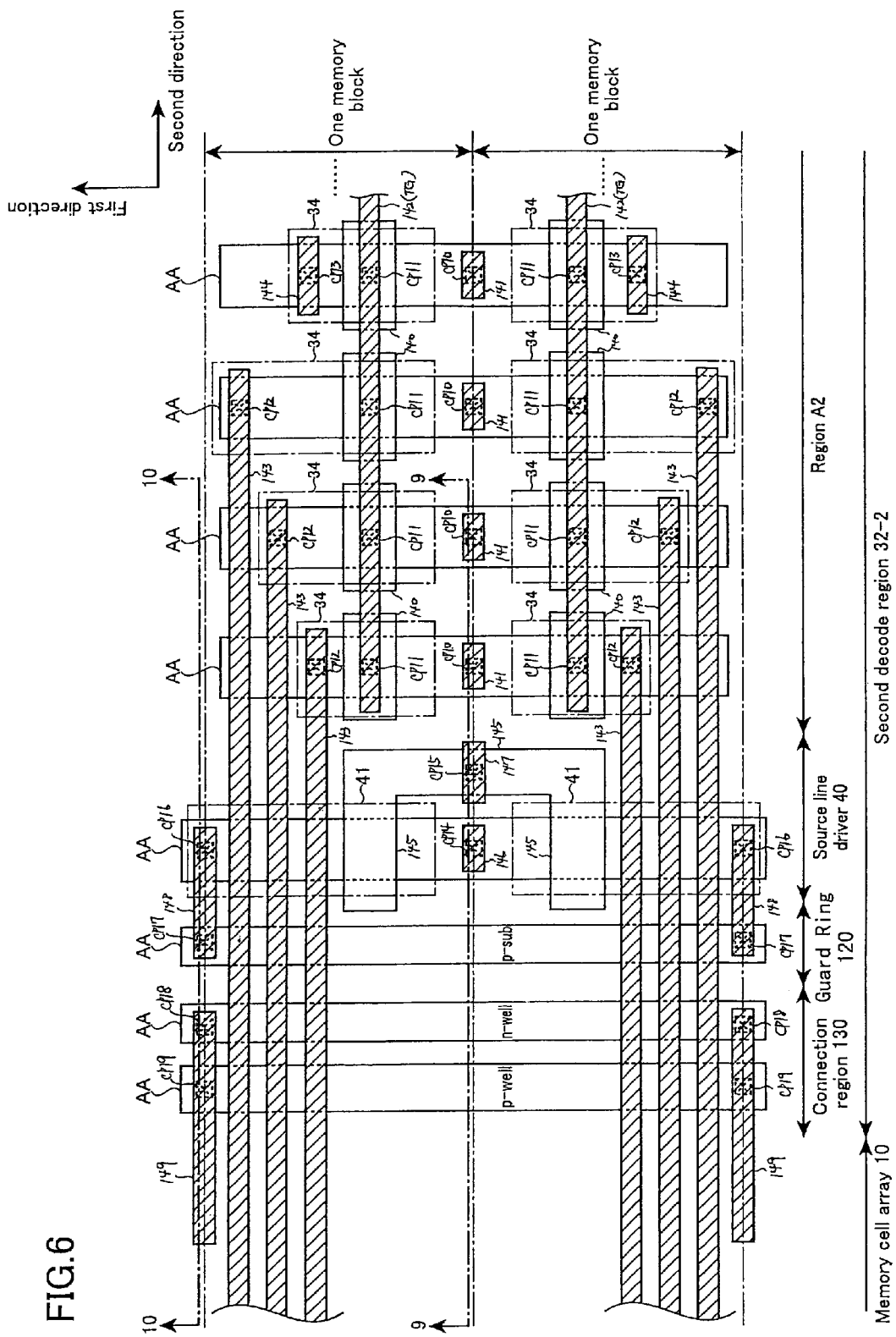
FIG. 6 is a plane view of a row decoder provided in the flash memory according to the first embodiment of the invention, and a view depicting a first-layer metal wiring layer.
Figure 7:
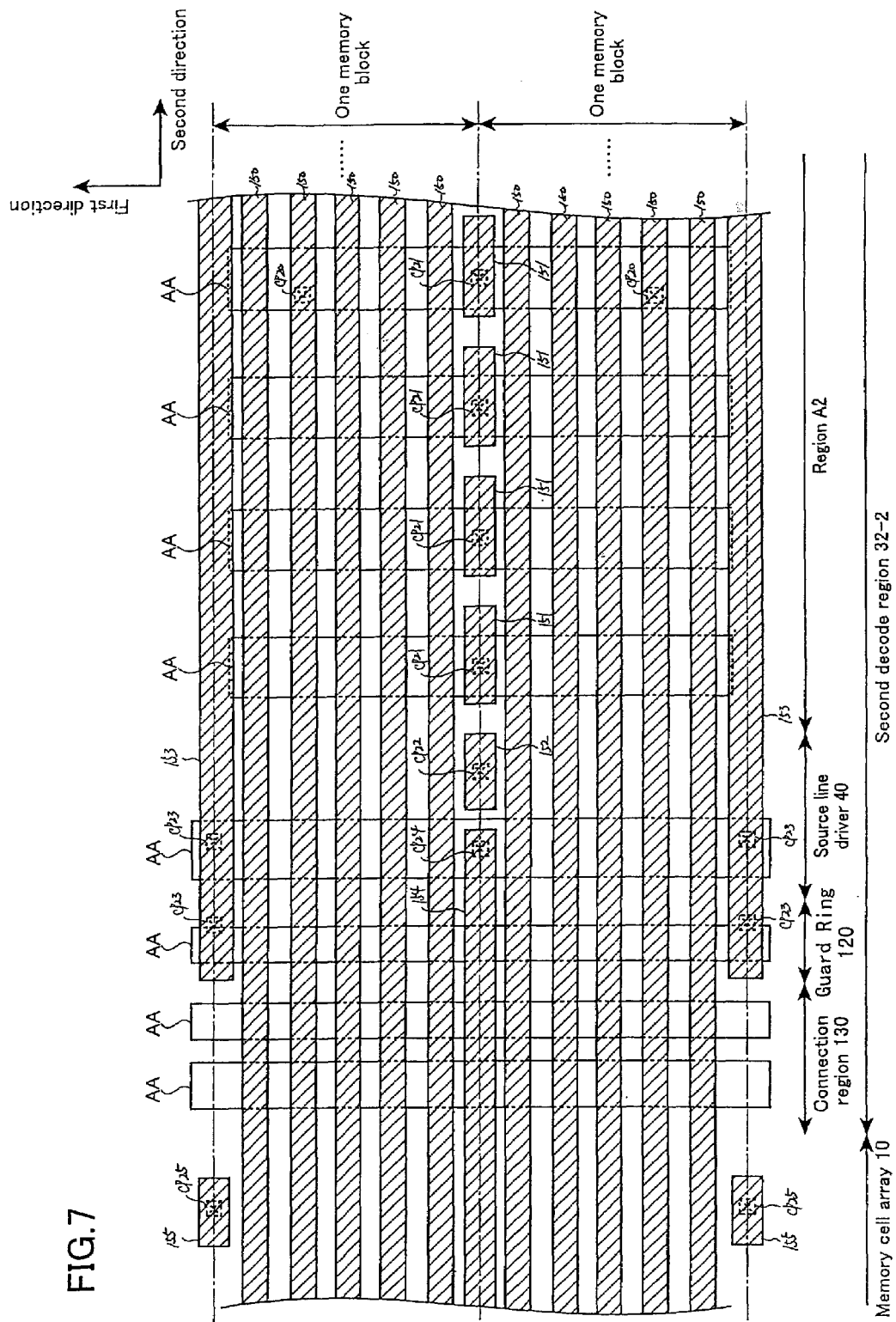
FIG. 7 is a plane view of the row decoder provided in the flash memory according to the first embodiment of the invention, and a view depicting a second-layer metal wiring layer.
Figure 8:
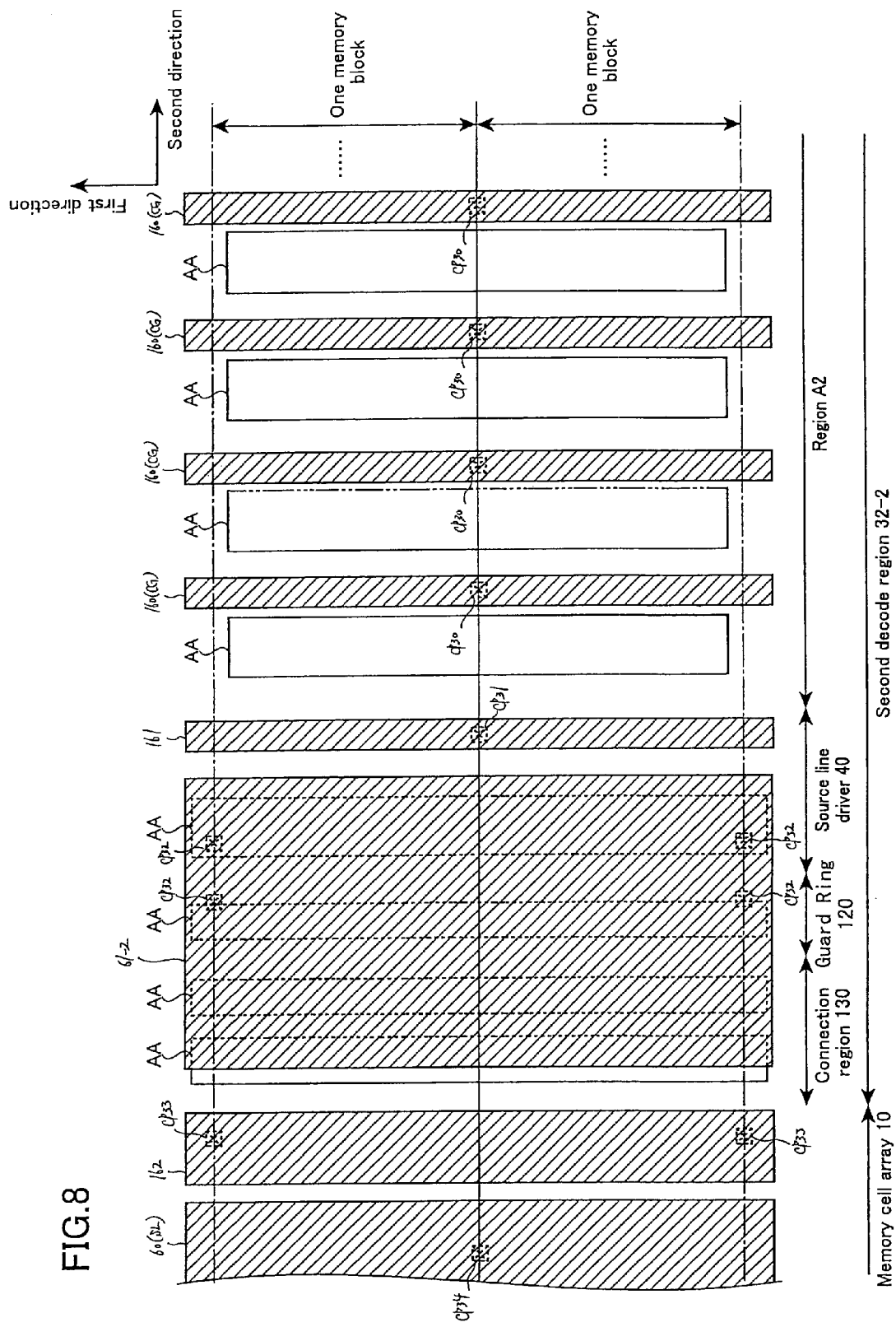
FIG. 8 is a plane view of the row decoder provided in the flash memory according to the first embodiment of the invention, and a view depicting a third-layer metal wiring layer.

Referring now to FIGS. 6 to 8, there are shown the plane configuration in the second decode region 32 in the row decoder 30. FIGS. 6 to 8 each depict the plane view of the region A1 in FIG. 3, and especially, each show regions including the transfer gate transistor 34 and the source line driver 40 in the second decode region 32-2, and regions of boundary part between the second decode region 32-1 and the memory cell array 10. FIG. 6 shows a gate electrode, and a plane pattern of a first-layer metal wiring layer disposed on the gate electrode in the region A1. FIG. 7 illustrates a plane pattern of a second-layer metal wiring layer disposed in the upper layer of the first-layer metal wiring layer in the same region as that of FIG. 6. FIG. 8 shows a plane pattern of a third-layer metal wiring layer disposed in the upper layer of the second-layer metal wiring layer in the same are as that of FIG. 6. Whole of the views from FIGS. 6 to 8 illustrate element regions for reference. In FIGS. 6 to 8, shaded regions indicate the metal wiring layers of the first to the third layers.

As depicted in figures, in addition to the region A2 in which the transfer gate transistor 34 is disposed and the MOS transistor 41 of the source line driver 40, a guard ring 120 and a connection region 130 are provided in the second decode region 32-2. The regions are arranged along the second direction in order of the connection region 130, the guard ring region 120, the source line driver 40 and region A2, namely in the order from the closest position to the memory cell array 10. The guard ring 120 is a region to apply a voltage (VSS=0 V) to the p-type semiconductor substrate 100. The connection region 130 is a region to make contacts with the n-type well region 101 and the p-type well region 102.

Firstly, the plane configuration up to the first-layer metal wiring layer will be described by referring to FIG. 6. A plurality of element regions AA configured as stripes along the first direction are disposed along the second direction in the region A2. Element isolation regions STI are formed between the element regions AA, and the element regions AA are electrically isolated from each other by the element isolation regions ST1s. Two transfer gate transistors 34 are formed along the first direction in one element region AA. That is, in each element region AA, two gate electrodes 140 are formed so as to span each element region AA along the second direction. An impurity diffusion layer to be one end and the other end of the current path of the transfer gate transistor 34 is formed in each element region AA. Two transfer gate transistors 34 positioned in the same element region AA share the other end of each current path. In the region A2, a plurality of transfer gates 34 positioned on the same row are used as the transfer gates for the word lines WL and the select gate line SGD and SGS connected to the same memory cell unit 11 (i.e., identical memory block).

A first-layer metal wiring layer 141 is formed at the other end of the current path of the forgoing transfer gate transistor 34 through a contact plug CP10. The metal wiring layers 141 each have an island shape, and are isolated from one another. A first-layer metal wiring layer 142 configured as stripes along the second direction is formed so as to commonly connect the gate electrode 140 of the transfer gate transistors 34 positioned on the same row. The metal wiring layer 142 functions as the control line (TG) has been described in FIG. 2, and connected to the block decoder 35 in a not shown region. The contact plug CP11 connects between the gate electrode 140 and the metal wiring layer 142. A first-layer metal wiring layer 143 connected to the word line WL is formed in a not shown region so as to extend from the memory cell array 10 to the region A2. Each of the metal wiring layers 143 is connected to one end in the current path of any one of transfer gate transistors 34 though the contact plug CP12. A first-layer metal wiring layer 144 is formed through a contact plug CP13 on one end of the current path of the transfer gate transistor 34 which is not connected to the metal wiring layer 143.

A region to form the source line driver 40 therein will be described hereinafter. As shown in the figure, element regions AA configured as stripes along the first direction are disposed in the semiconductor substrate 100. Two MOS transistors 41 along the first direction are formed in one element region AA. That is, in each element region AA, two gate electrodes 145 are formed so as to span each element region AA along the second direction. The two gate electrodes 145 are connected to each other at the boundary region to, for example, the region A2. In other words, in one element region AA, one gate electrode 145 is disposed so that it is positioned at two spots on the element region AA. In the element region AA, the impurity diffusion layers to be the source and the drain of the MOS transistor 41 are formed. Two MOS transistors 41 positioned in the same element region AA share each drain.

A first-layer metal wiring layer 146 is formed above the drain of the MOS transistor 41 through the contact plug CP14. A first-layer metal wiring layer 147 is formed above the gate electrode 145 through a contact plug CP15. Further, above the source of the MOS transistor 41, a first-layer metal wiring layer 148 is formed through a contact plug CP16. The metal wiring layer 148 is pulled out from the inside of the source line driver 40 up to the guard ring 120.

Next, the configuration of the guard ring 120 will be described. As shown in figure, element regions AA configured as stripes along the first direction are disposed in the semiconductor substrate 100. The surface of the p-type semiconductor substrate 100 is exposed in the element region AA. Contact plugs CP 17 are formed on the element region AA, and the metal wiring layer 148 is connected to the contact plug CP17.

The configuration of the connection region 130 will be set forth below. As depicted in figure, two element regions AA configured as stripes along the first direction are disposed in the semiconductor substrate 100. In one element region AA, the surface of the n-type well region 101 is exposed, and in the other element region AA, the surface of the p-type well region 102 is exposed. A contact plug CP18 is formed on the n-type well region 101, and a contact plug CP19 is formed on the p-type well region 102. The contact plugs CP18 and CP19 are connected to a first-layer metal wiring layer 149. Namely, the n-type well region 101 and the p-type well region 102 are made to be the same electric potential by the metal wiring layer 149. The metal wiring layer 149 is configured as stripes along the second direction, and pulled out from the connection region 130 up to the memory cell array 10.

Referring now to FIG. 7, there is shown the plane configuration of a metal wiring layer of a second layer. As illustrated in the figure, a second-layer metal wiring layer 150 along the second direction is pulled out from the memory cell array 10 up to the region A2. The metal wiring layer 150 is connected to the word line WL in a not shown region. Both the metal wiring layer 150 and the metal wiring layer 143 which has been described in FIG. 6 are ones used for pulling out the word lines WL to the region A2. The reason to use not only the metal wiring layer 143, but also the metal wiring layer 150 is that it is hard to pull out all word lines WL to the region A2 by using only the metal wiring layer 143 because the intervals between adjacent word lines WL are narrow. In contrast, using the metal wiring layers 143 and 150 of two layers allows pulling out all word lines WL to the region A2 even if the region is limited. The metal wiring layer 150 is then connected to the first-layer metal wiring layer 144 through a contact plug CP20. The metal wiring layer 150 is connected to one end of the current path of any one of the transfer gate transistors 34 through the contact plugs CP20 and CP13, and the metal wiring layer 144.

Second layer metal wiring layers 151 which are isolated from one another are formed in the region just above the first-layer metal wiring layers 141. Each metal wiring layer 151 is connected to the corresponding metal wiring layer 141 by the contact plug CP2. A second-layer metal wiring layer 152 is formed in the region just above the first metal wiring layer 147. The metal wiring layer 152 is connected to the metal wiring layer 147 by the contact plug CP22.

Further, a second-layer metal wiring layer 153 configured as stripes along the second direction is formed from the guard ring 120 up to the not shown first decode region 31-2 through the region A2. The metal wiring layer 153 is connected to the first-layer metal wiring layer 148 by contact plugs CP23. The metal wiring layer 153 functions as a transfer line of the voltage VSS and functions as a power source line in the first decode region 31-2.

A second-layer metal wiring layer 154 configured as stripes along the second direction is formed extending from the source line driver 40 to the memory cell array 10. The metal wiring layer 154 is connected to the first-layer metal wiring layer 146 by the contact plug CP24. Moreover, a second-layer metal wiring layer 155 is formed at the boundary region between the second decode region 32-2 and the memory cell array 10. The metal wiring layer 155 is connected to the metal wiring layer 149 though a contact plug CP25.

Referring now to FIG. 8, a plane configuration of a third-layer metal wiring layer will be described. In the region A2, as shown in the figure, third-layer metal wiring layers 160 shaped in strips along the first direction are disposed. The metal wiring layers 160 are disposed for each second-layer metal wiring layer 151, and connected to the corresponding metal wiring layers 151 by contact plugs CP30. The metal wiring layer 160 is connected to the block decoder 35 in the region (not shown), and functions as control line TG described for FIG. 2.

Also in the source driver 40, a third-layer metal wiring layer 161 is configured as stripes along the first direction. The metal wiring layer 161 is connected to the second-layer metal wiring layer 152 through a contact plug CP31. That is, the metal wiring layer 161 is connected to the gate of the MOS transistor 41 of the source driver 40, and the signal SRCVSS described for FIG. 2 is supplied to the metal wiring layer 161.

Further, a metal wiring layer 61-2 configured as stripes along the first direction is formed on the source driver 40, the guard ring 120 and the connection region 130. The metal wiring layer 61-2 functions as the VSS wiring, as described by referring to FIG. 3, and connected to the second-layer metal wiring layer 153 by the contact plug CP32.

A third-layer metal wiring layer 162 configured as stripes along the first direction is formed at the boundary region between the second decode region 32-2 and the memory cell array 10. The metal wiring layer 160 is connected to the second-layer metal wiring layer 155 through a contact plug CP33. Namely, the metal wiring layer 162 functions as well wiring and connected to the n-type well region 101 and the p-type well region 102 through the contact plugs CP33, CP25, CP18, CP19, and the metal wiring layers 155 and 149. The metal wiring layer 155 is pulled out up to the well driver 50 shown in FIG. 3 to be connected to the drains of the MOS transistors 51 and 52 in the well driver 50.

Moreover, a source line SL is formed at the upper part of the memory cell array 10 by a third-layer metal wiring layer 60. The metal wiring layer 60 is connected to the second-layer metal wiring layer 154 by a contact plug CP34. That is, the metal wiring layer 60 is connected to the drains of the MOS transistors 41 and 42 in the source line driver 40 through the contact plugs CP34, CP24, CP14, and the metal wiring layers 154 and 146.

Figure 9:
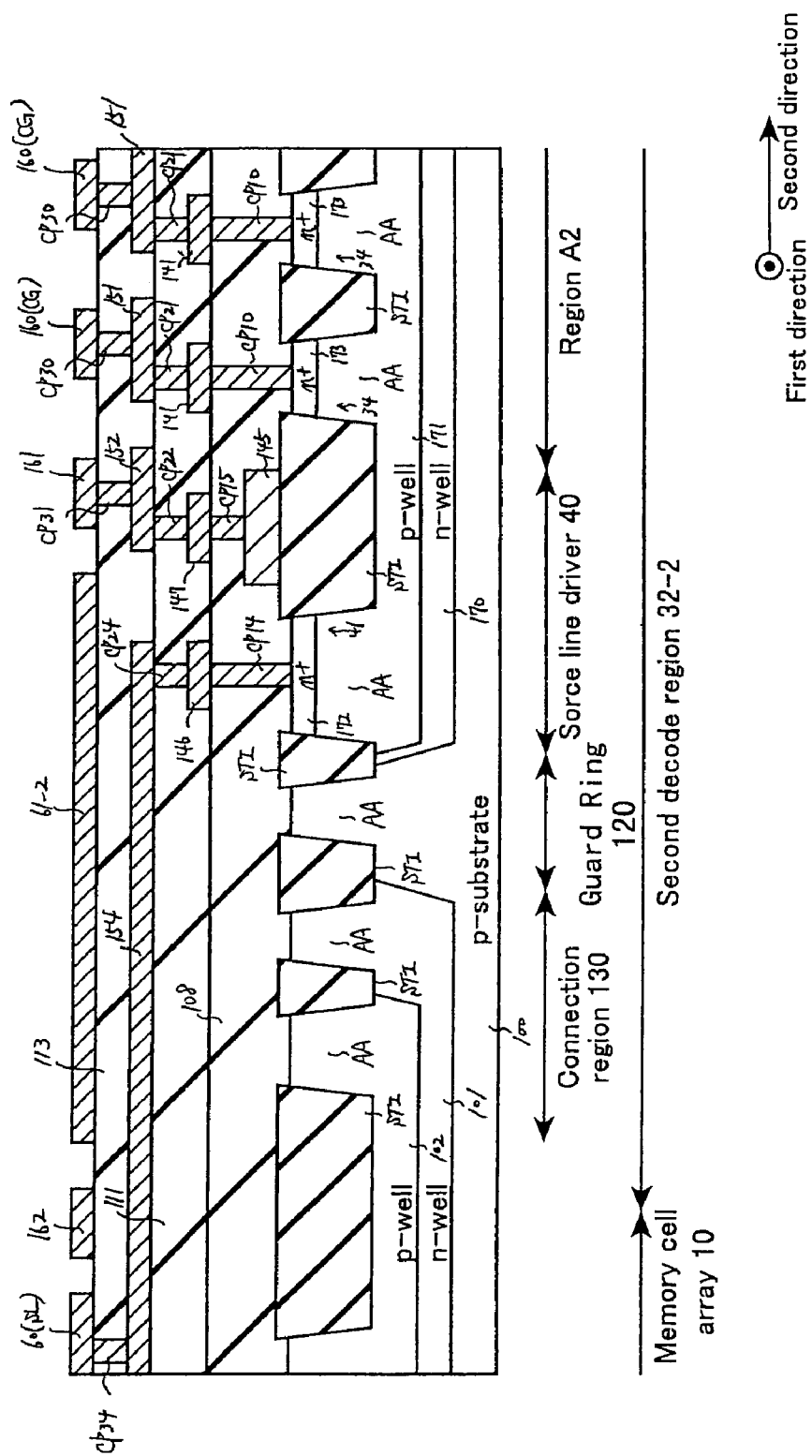
FIG. 9 is a cross-sectional view of the row decoder provided in the flash memory according to the first embodiment of the invention, and a cross-sectional view along a line 9-9 in FIG. 6.

Next to this, a cross-sectional configuration of the second decode region 32-2 configured above will be described. Firstly, the region along the line 9-9 of FIG. 6 will be described with reference to FIG. 9. FIG. 9 is a cross-sectional view along the line 9-9 in FIG. 6.

As shown in FIG. 9, n-type well regions 101 and 170 are formed in a surface region of the p-type semiconductor substrate 100, so as to be isolated from each other. P-type well regions 102 and 171 are formed within the n-type well regions 101 and 170, respectively. A plurality of element isolation regions STI are formed in the surface region of the semiconductor substrate 100.

The p-type well region 102 is exposed in the element region AA in the memory array 10. The n-type well region 101 and the p-type well region 102 are exposed in the element region AA in the connection region 130. The p-type semiconductor substrate 100 is exposed in the element region AA in the guard ring 120. The p-type well region 171 is exposed in the element region AA in the source line driver 40 and the region A2.

$N^+$-type impurity diffusion layers 172 and 173 are formed in the surface of the well region 171. The diffusion layer 172 functions as the drain region of the MOS transistor 41 of the source line driver 40. The diffusion layer 173 functions as the other end of the current path of the transfer gate transistor 34. Further, in the source line driver 40, a part of the gate electrode 145 of the MOS transistor 41 is formed on the element isolation region STI.

The inter-layer isolating film 108 is formed on the semiconductor substrate 100. The contact plugs CP14, CP10 and CP15 reaching the impurity diffusion layers 172 and 173, and the gate electrode 145, respectively, are formed in the inter-layer insulating film 108. The metal wiring layers 146, 147 and 141 connected to the contact plugs CP14, CP15 and CP10, respectively, are formed on the inter-layer insulating film 108.

An inter-layer insulating film 111 is formed on the inter-layer insulating film 108 so as to cover the metal wiring layers 146, 147, and 141. Contact plugs CP24, CP22 and CP21 reaching the metal wiring layers 146, 147, and 141, respectively, are formed in the inter-layer insulating film 111. The metal wiring layers 154, 152 and 151 connected to the contact plugs CP24, CP22 and CP21, respectively, are formed on the inter-layer insulating film 111. The metal wiring layer 154 is arranged so as to cross from the source line driver 40 to the memory cell array 10.

The inter-layer insulating film 113 is formed on the inter-layer insulating film 111 so as to coat the metal wiring layers 154, 152 and 151. The contact plugs CP34, CP31 and CP30 reaching the metal wiring layers 154, 152 and 151, respectively, are formed in the inter-layer insulating film 113. The metal wiring layers 60, 161 and 160 connected to the contact plugs CP34, CP31 and CP30, respectively, are formed on the inter-layer insulating film 113, and moreover, the metal wiring layers 162 and 61-2 are formed thereon.

Figure 10:
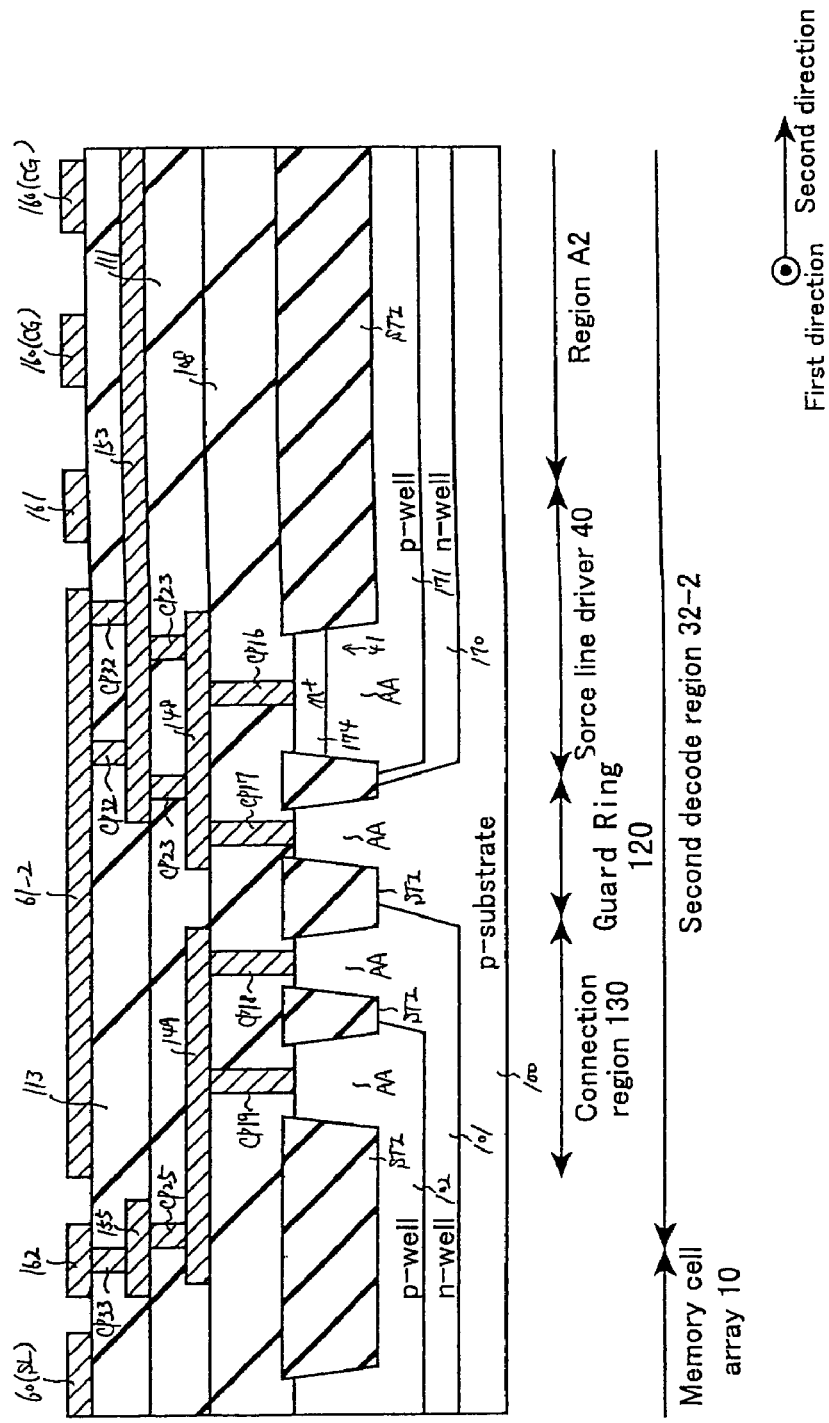
FIG. 10 is a cross-sectional view of the row decoder provided in the flash memory according to the first embodiment of the invention, and a cross-sectional view along a line 10-10 in FIG. 6.

Referring now to FIG. 10, the region along the line 10-10 in FIG. 6 will be described. FIG. 10 illustrates the cross-sectional view along the line 10-10 in FIG. 6.

As illustrated in the figure, the well regions 101, 102, 170 and 171 are formed in the semiconductor 100 as mentioned for FIG. 9. However, in the region illustrated in FIG. 10, the element insulating region STI is formed within the surface region of the p-type well region 171 in the region A2, and the element region AA is not formed. An n$^+$-type impurity diffusion layer 174 is formed in the surface region in the element region AA in the source line driver 40. The diffusion layer 174 functions as the source region of the MOS transistor 41 of the source line driver 40.

The inter-layer insulating film 108 is formed on the semiconductor substrate 100. The contact plugs CP16 to CP19 are formed in the inter-layer insulating film 108. The contact plug CP16 is connected to the source of the MOS transistor 41 of the source line driver 40. The contact plugs CP17 to CP19 are connected to the semiconductor substrate 100, the n-type well region 101, and the p-type well region 102, respectively. The metal wiring layer 148 connected to the contact plugs CP16 and CP17, and the metal wiring layer 149 connected to the contact plugs CP18 and CP19 are formed on the inter-layer insulating film 108.

The inter-layer insulating film 111 is formed on the inter-layer insulating film 108 is formed so as to cover the metal wiring layers 148 and 149. The contact plugs CP23 and CP25 which reach the metal wiring layers 148 and 149, respectively, are formed in the inter-layer insulating film 111. The metal wiring layers 153 and 155 connected to the contact plugs CP23 and CP25, respectively, are formed on the inter-layer insulating film 111. The metal wiring layer 153 crosses from the source line driver 40 to the first decode region 31-2 (not shown).

The inter-layer insulating film 113 is formed on the inter-layer insulating film 111 so as to cover the metal wiring layers 153 and 155. The contact plugs CP32 and CP33 reaching the metal wiring layers 153 and 155, respectively, are formed in the inter-layer insulating film 113. The metal wiring layers 61-2 and 162 connected to the contact plugs CP32 and CP33, respectively, are formed on the inter-layer insulating film 113, and further, the metal wiring layers 60, 160 and 161 are formed thereon.

FIGS. 6 to 10 each illustrate the region A1 in FIG. 3, namely the configuration of the boundary region between the row decoder 30-1 and the memory cell array 10. The configuration of the boundary region between the row decoder 30-2 and the memory cell array 10 is also similar to those of FIGS. 6 to 10. FIGS. 9 and 10 show the examples in which each MOS transistor in the second decode region 32-2 is formed on the p-type well region 171 disposed in the surface of the n-type well region 170. However, the n-type well region 170 and the p-type well region 171 are not always needed, and each MOS transistor may be directly formed on the semiconductor substrate 100.

As mentioned above, the NAND-type flash memory according to the first embodiment of the invention gives the following effect (1).

(1) The semiconductor memory device can improve the ability of the source line driver, and can improve the operation reliability of the NAND-type flash memory (first item).

The NAND-type flash memory according to the embodiment arranges the n-channel MOS transistor 41 of the source driver 40 not only inside the sense amplifier 20, but also inside the row decoder 30, especially also inside the second decode region 32 that is the high voltage region.

Furthermore, as illustrated in FIG. 3, the VSS wiring formed by the metal wiring layers 61-1, 61-2, 62-1 and 62-2 is formed so as to surround the periphery of the memory cell array 10. Therefore, the current flowing into the VSS wiring from the source line SL is deconcentrated. As a result, it may reduce an effective resistance component of the VSS wiring. Two pads 80-1 and 80-2 apply the voltage VSS to the VSS wiring. Therefore, the electrical potential of the VSS wiring may be strongly fixed to the voltage VSS.

The source line SL is disposed, as shown in FIG. 3, to cover the upper face of the memory cell array 10, and the VSS wiring is arranged so as to surround the periphery of the source line SL. The source line driver 40 is arranged not only the inside of the sense amplifier 20-2, but also the insides of the row decoders 30-1 and 30-2. Therefore, the entire region including the memory cell array 10, the sense amplifier 20 and the row decoder 30 acts as the source line driver 40. Accordingly, the NAND-type flash memory may improve the ability of the source line driver 40 dramatically, and may suppress the electrical potential fluctuation in the source line SL.

The sense amplifier 20 senses current flowing through the bit line BL, or senses the potential fluctuation of the bit line BL to sense the data to be read. Therefore, when the current flowable into the bit line BL is small, or when the electrical potential of the source line SL fluctuates, a reading error is liable to occur. However, the configuration according to the embodiment improves the ability of the source line driver 40 depending on the configuration mentioned above. Therefore, the NAND-type flash memory may improve the reading operation reliability of the NAND-type flash memory by increasing the current quantity flowable into the bit line BL and by suppressing the potential fluctuation in the source line SL.

Second Embodiment

Figure 11:
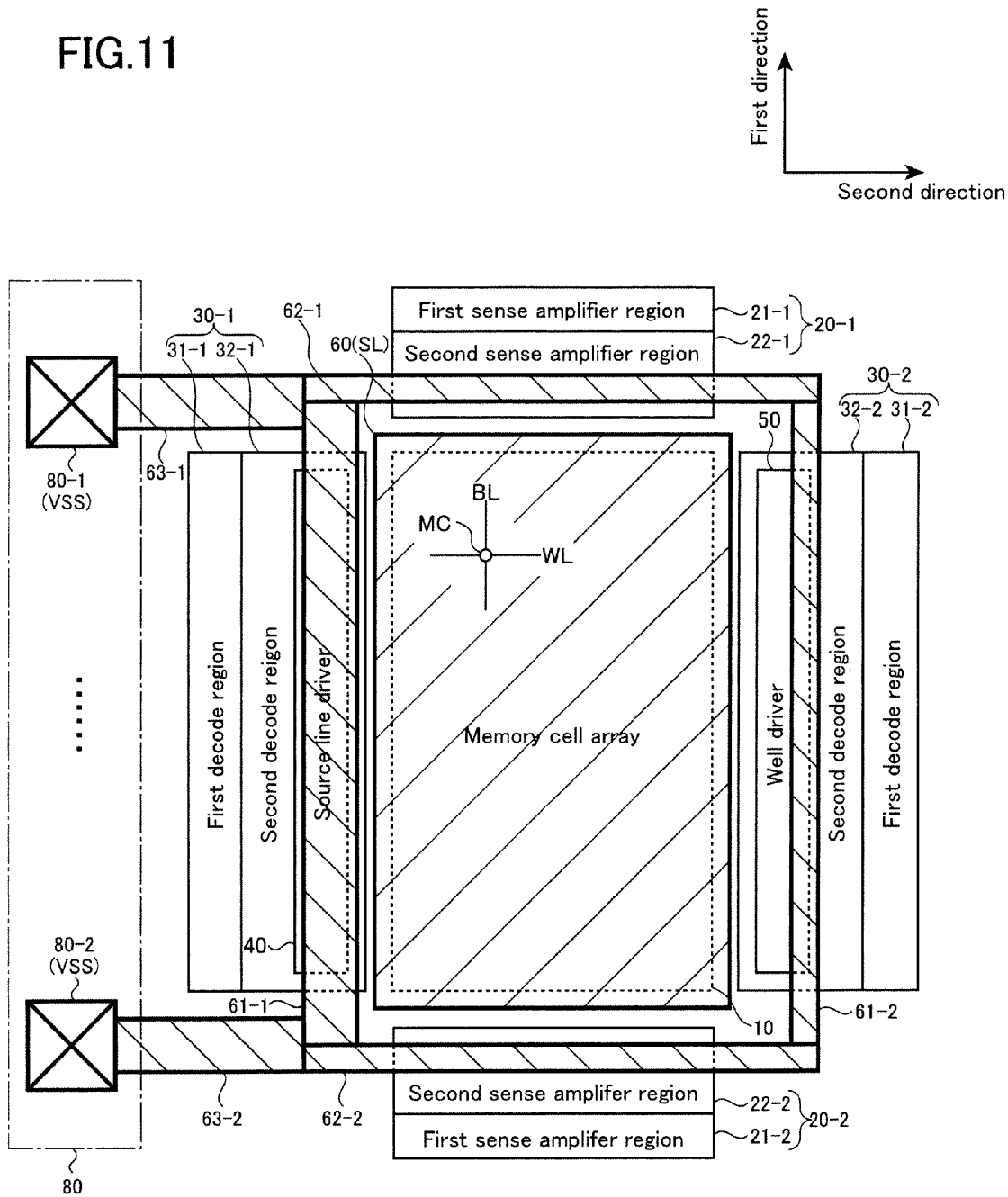
FIG. 11 is a plane view of a flash memory according to a second embodiment of the invention.

The semiconductor memory device according to a second embodiment of the invention will be described hereinafter. The second embodiment is a semiconductor memory device which is obtained by shifting the positions of the input/output pad group 80 and the well driver 50 in the first embodiment. Other components of the configuration of the second embodiment being the same as those of the first embodiment, the explanations therefore will be omitted. FIG. 11 is a plane view of the NAND-type flash memory 1 based on the second embodiment; it illustrates the plane arrangement of the memory cell array 10, the sense amplifier 20, the row decoders 30, the source line driver 40, the well driver 50 and the input/output pad group 80. FIG. 11 eliminates to illustrate the VDD wiring.

As shown in FIG. 11, the arrangement of the memory sell array 10, the sense amplifiers 20-1 and 20-2, and the row decoders 30-1 and 30-2 is the same as that of the first embodiment. The second embodiment firstly differs from the first embodiment in the arrangement in which the input/output pad group 80 is disposed to be adjacent to the row decoder 30-1 in the second direction. That is, the row decoder 30-1 is disposed so as to be sandwiched by the input/output pad group 80 and the memory cell array 10 along the second direction.

Further, the source line driver 40 and the well driver 50 are removed from the inside of the sense amplifier 20, and the well driver 50 is disposed in the second decode region 32-2 of the row decoder 30-2.

The second embodiment includes the metal wiring layers 62-1, 61-2, 62-2, and 62-3, as the first embodiment includes them. However, the metal wiring layer 61-2 is connected to the source of the MOS transistor 51 of the well driver 50 to function as the VSS wiring of the well driver 50. The metal wiring layer 62-1 and 62-2 are provided in order to connect the metal wiring layer 61-1 and 61-2 to each other.

The metal wiring layers 61-1, 61-2, 62-1, and 62-2 are, similarly to the first embodiment, mutually connected so as to surround the source line SL, and they function as the VSS wiring of the source line driver 40 and the well driver 50.

The metal wiring layers 63-1 and 63-2 configured as stripes along the second direction are disposed so as to contact with both ends along the first direction of the metal wiring layer 62-1. The metal wiring layer 63-1 and 63-2 connects the metal wiring layer 61-1 to the pads 80-1 and 80-2. The voltage VSS is externally applied to the pads 80-1 and 80-2. The current flowing through the well driver 50 being smaller than the current flowing through the source line driver 40, the wiring width of the metal wiring layers 61-2, 62-1 and 62-2 can be narrower than those of the metal wiring layers 61-1, 63-1 and 63-2.

The plane configuration and the cross-sectional configuration of the row decoder 30-1 are the same as those of FIGS. 6 to 10 which have been described for the first embodiment. The plane configuration and the cross-sectional configuration of the row decoder 30-2 are ones obtained by replacing the source line driver 40 by the well driver 50 in each of FIGS. 6 to 10.

As described above, the NAND-type flash memory based on the second embodiment of the invention has effects of the following (2) to (4).

(2) The NAND-type flash memory may improve the ability of the source line driver, and may improve the operation reliability of the NAND-type flash memory (second item).

According to the NAND-type flash memory of the present embodiment, the n-channel MOS transistor 41 of the source line driver 40 is disposed in the row decoder 30, more specifically, inside the second decode region 32 that is a high voltage region, in the arrangement in which the input/output pad group 80 is adjacent to the row decoder 30. Therefore, this NAND-type flash memory may improve the ability of the source line driver 40.

The present effect will be described below. In the configuration, which has been disclosed by Jpn. Pat. Appln. KOKAI Publication No. 2005-142431 and described in BACKGROUND of this specification, a source line driver is provided in a sense amplifier. For instance, in FIG. 11, the source line driver is disposed only in the sense amplifier 20-1. The VSS wiring of the source line driver is, then, connected only to the pad 80-1, and it is hard to be connected to the pad 80-2. Specifically, if the case in which a well driver is also disposed in the sense amplifier 20-2 is taken into account, the pad 80-2 is connected only to the VSS wiring of the well driver. This is because it is hard to secure the wiring space for the VSS wiring. Ideally, it is preferable for the VSS wiring of the source line driver to be connected both two pads 80-1 and 80-2. Because the use of two pads 80-1 and 80-2 allows the electrical potential of the VSS wiring of the source line driver to strongly fix to the voltage VSS. However, it is very difficult for a configuration in which the source line driver is disposed in the sense amplifier to adopt the foregoing configuration.

In contrast, the configuration according to the second embodiment disposes the source line driver 40 in the row decoder 30-1 adjacent to the input/output pad group 80. Therefore, it becomes possible for the metal wiring layer 61-1 to be connected to the pads 80-1 and 80-2 at the two points thereof. Like this, even if the position of the input/output pad group 80 differs from that of in the first embodiment, the VSS wiring of the source line driver 40 may be connected to the two pads 80-1 and 80-2. The NAND-type flash memory therefore may suppress the voltage fluctuation in the VSS wiring, and as a result, it may improve the ability of the source line driver 40.

(3) The NAND-type flash memory may improve the operation ability of the sense amplifier while suppressing an increase in a chip size.

The configuration disclosed by Jpn. Pat. Appln. KOKAI Publication No. 2005-142431 disposes the source line driver in the sense amplifier. In this case, the contact with the source line SL having been made, the source line SL occupies the most of the upper part of the high voltage region in the sense amplifier. Then, even if the NAND-type flash memory arranges the VSS wiring and the VDD wiring for the sense amplifier and intends to fully secure the power source, it cannot arrange the wiring at the upper part of the high voltage region. Therefore, the NAND-type flash memory has to arrange the wiring in another region, and it increases in chip size. On the other hand, if the NAND-type flash memory intends to suppress the increase in chip size without arranging the wiring in another region, it cannot fully secure the power source for the sense amplifier, and results in deterioration of the operation reliability of the sense amplifier. Arranging the source line driver in another region poses adverse effect by increasing the resistance of the source line SL.

Figure 12:
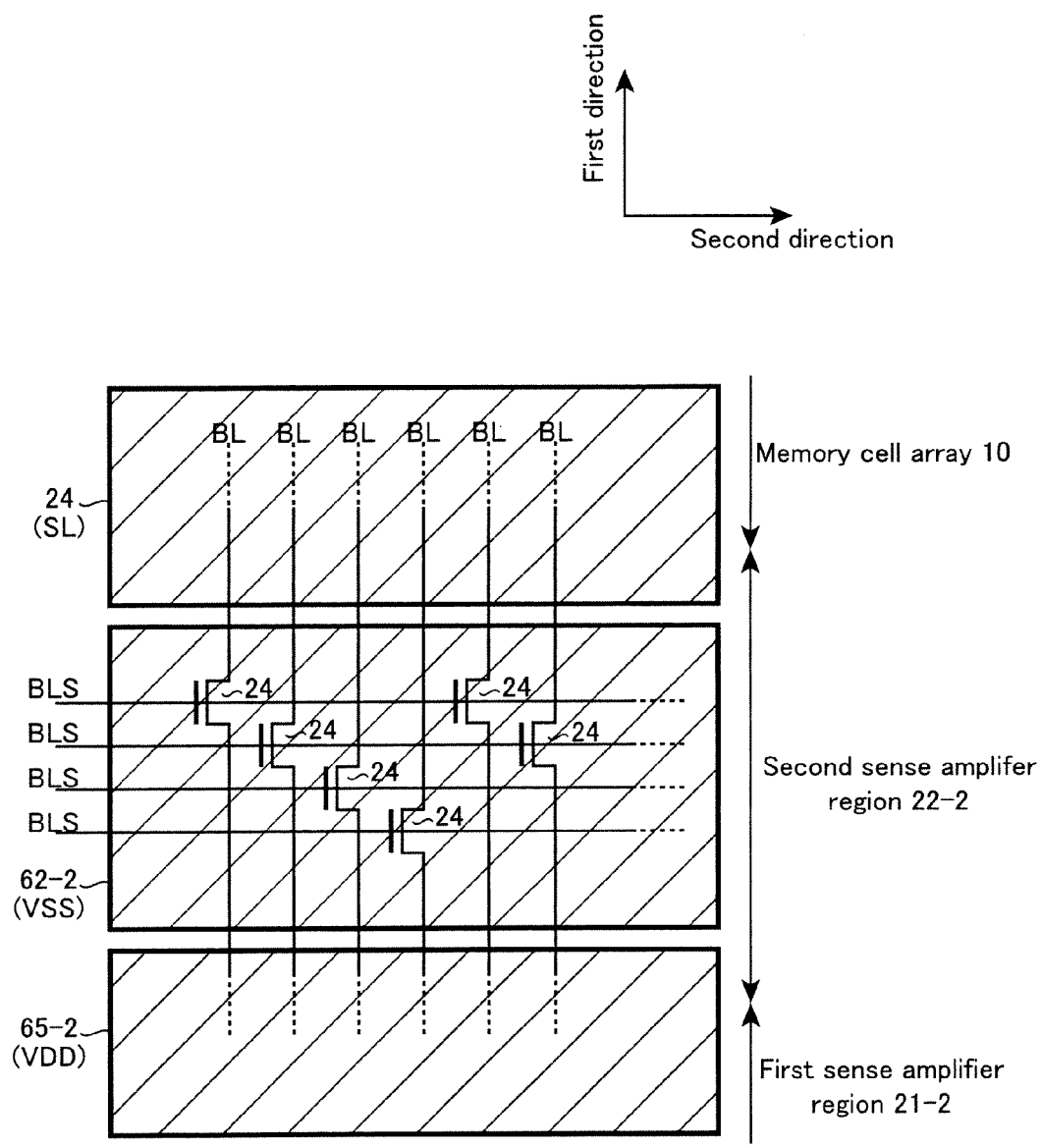
FIG. 12 is a plane view of a sense amplifier provided in the flash memory according to the second embodiment of the invention.

However, in the configuration according to the second embodiment, the source line driver 40 is disposed in the row decoder 30-1. In this case, as shown in FIG. 11, it happens that there is no need to provide the source line driver for the sense amplifiers 20-1 and 20-2 sometimes. The regions above the sense amplifiers 20-1 and 20-2 then become empty regions. Therefore, the empty regions may accommodate the arrangement of the VSS wiring and the VDD wiring for the sense amplifiers 20-1 and 20-2. Thus, the NAND-type flash memory may sufficiently secure the power source for the sense amplifier 20 to enhance the operational reliability of the sense amplifier 20 wile suppressing the increase in chip size. FIG. 12 shows this aspect. FIG. 12 is the plane view of the sense amplifier 20-2 of the NAND-type flash memory according to the second embodiment. The same goes for the sense amplifier 20-1.

As depicted in the figure, the configuration according to the embodiment allows disposing the metal wiring layer 62-2 functioning as the VSS wiring above the second sense amplifier region 22-2 that is the high voltage region. The metal wiring layer 62-2 may be used as the VSS wiring of the sense amplifier 20-2. The configuration may arrange the metal wiring layer 65-2 functioning as the VDD wiring onto the first sense amplifier region 21-2. The metal wiring layer 65-2 also may be used as the VDD wiring for the sense amplifier 20-2.

(4) The NAND-type flash memory has effect like the aforementioned effects (1) to (3) also in respect to the well driver 50.

The configuration based on the embodiment arranges the well driver 50 in the row decoder 30-2 adjacent to the input/output pad group 80. This configuration connects the metal wiring layer 61-2 functioning as the VSS wiring of the well driver 50 to the metal wiring layer 61-1 through the metal wiring layers 62-1 and 62-2. Thereby, the current flowing into the VSS wiring of the well driver 50 is deconcentrated and the potential fluctuation in the VSS wiring is suppressed, so that it can enhance the drive ability of the well driver 50.

Moreover, there being no need to dispose the well driver 50 in the sense amplifier 20, the configuration may produce an empty region in the region on the sense amplifier 20. Accordingly, this empty region also may be used for accommodating the VSS wiring and the VDD wiring.

Third Embodiment

Figure 13:
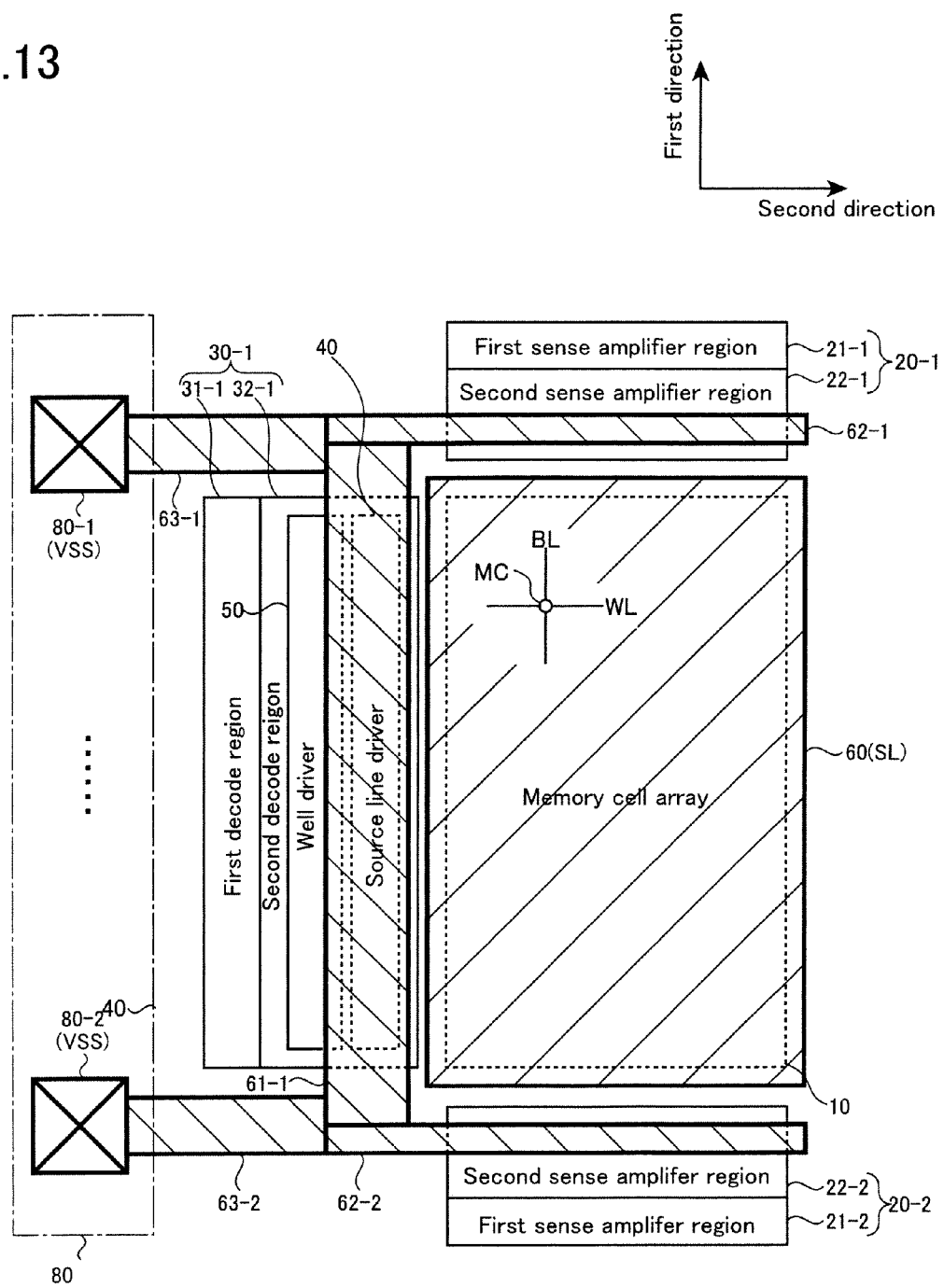
FIG. 13 is a plane view of a flash memory according to a third embodiment of the invention.

A semiconductor memory device according to a third embodiment of the invention will be set forth hereinafter. The third embodiment removes the row decoder 30-2 and arranges both the source line driver 40 and the well driver 50 in the row decoder 30-1 in the structure of the second embodiment. Other configurations going the same as those of the second embodiment, the explanations therefore will be omitted. FIG. 13 is the plane view of the NAND-type flash memory based on the embodiment, and illustrates the plane arrangement of the memory cell array 10, the sense amplifier 20, the row decoder 30, the source line driver 40, the well driver 50, and the input/output pad group 80. FIG. 13 eliminates to indicate the VDD wiring.

The flash memory 1 according to the embodiment, as shown in figure, removes the row decoder 30-1 and the metal wiring layer 61-2 and disposes the well driver 50 in the second decode region 32-1 of the row decoder 30-1, in the configuration of FIG. 11 described in the second embodiment.

Figure 14:
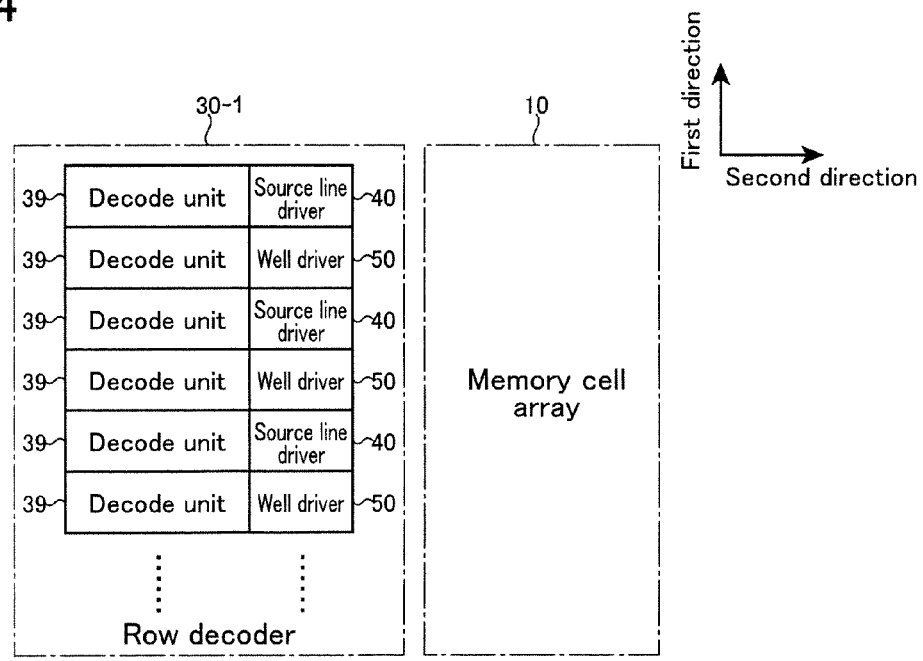
FIGS. 14 to 17 are block diagrams of row decoders each provided in the flash memory according to the third embodiment of the invention.

FIG. 14 roughly shows a block diagram of a configuration example of the inside of the row decoder 30-1. As shown in the figure, the plurality of decode units 39, source line drivers 40 and well drivers 50 are provided in the row decoder 30-1. Each of the decode units 39 corresponds to one memory block and includes the transfer gate transistor 34, the word line driver 36 and the select gate line driver 37 and 38 to select the corresponding memory block.

In the row decoder 30-1, the source line drivers 40 and the well drivers 50 are arranged one after the other along the first direction. Each source line driver 40 and well driver 50 is arranged one for one to each decode unit 39. That is to say, the pitches along each first direction of the source line driver 40 and the well driver 50 are made equal to those along the first direction of the decode unit 39. In other words, each size of the source line driver 40 and the well driver 50 is made so that each length along the first direction becomes equal to that of the decode unit 39. Therefore, each of the source line drivers 40 and the well drivers 50 has the same region occupied by one decode unit 39, and arranged repeatedly along the first direction.

Figure 15:
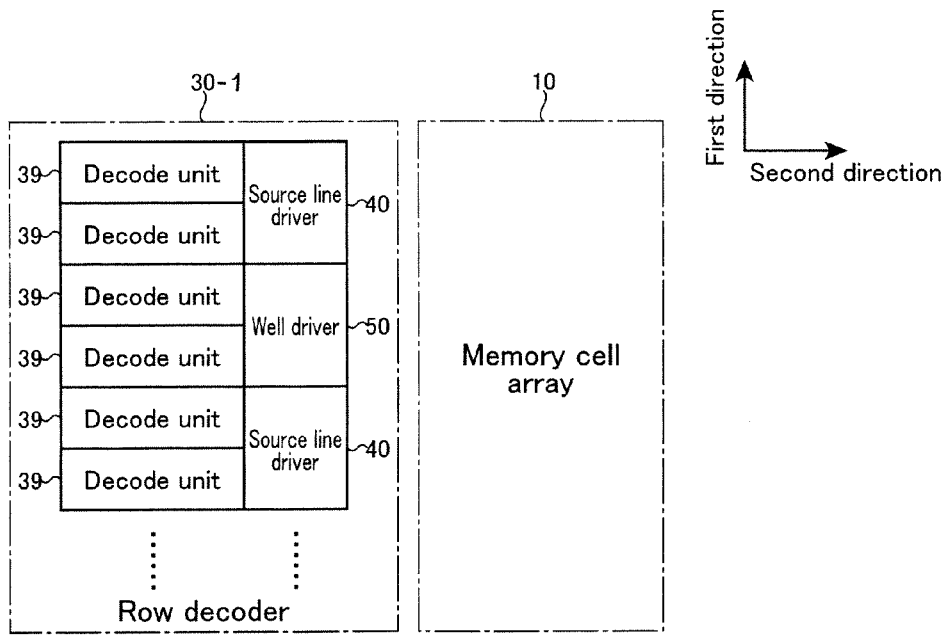

FIG. 15 is a block diagram of the row decoder 30-1, and illustrates another configuration example differing from that of FIF. 14. As illustrated in the figure, each source driver line 40 and well driver 50 is arranged one to two to each decode unit 39. That is, the pitches along each first direction of the source line driver 40 and the well driver 50 are made equal to those along the first direction of the two decode units 39. In other words, each size of the source line drivers 40 and the well drivers 50 is made so that each length along the first direction is selected to be a length twice that of the decode unit 39. Accordingly, each of the source line drivers 40 and the well drivers 50 has a region occupied by two decode units 39, and repeatedly disposed along the first direction.

Figure 16:
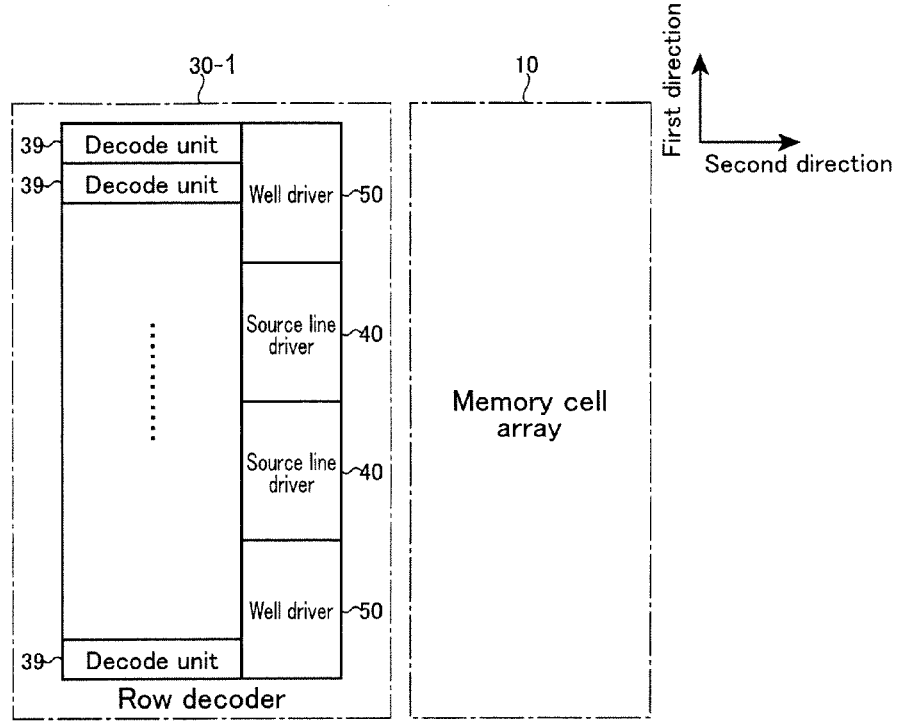

As mentioned above, the plurality of source line drivers 40 and well drivers 50 may be distributed and disposed in the row decoder 30-1. Or, the source line drivers 40 and the well drivers 50 may be disposed all together in the row decoder 30-1. FIG. 16 will explain about such a case.

FIG. 16 is a block diagram of the row decoder 30-1, and shows configuration differing from those of FIGS. 14 and 15. As shown in FIG. 16, the source line drivers 40 are arranged at the center part along the first direction in the row decoder 30-1. In contrast, the well drivers 50 are arranged so as to sandwich the source drivers 40 in the first direction. That is, the source line drivers 40 and the well drivers 50 are arranged so that two well drivers 50 face each other through the intervention of the source line drivers 40 in the first direction.

Figure 17:
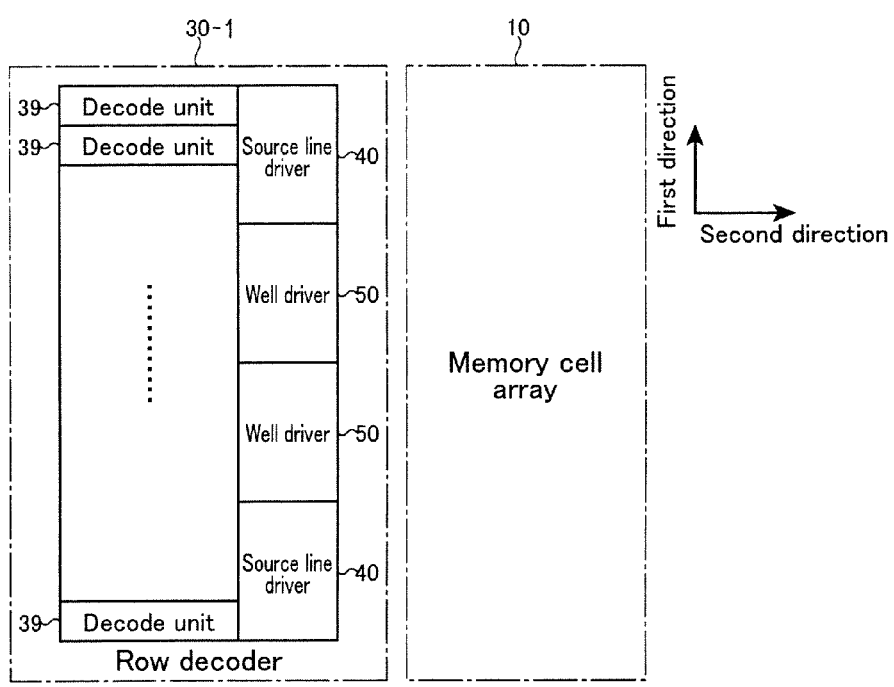

FIG. 17 is a block diagram of the row decoder 30-1, and shows configuration differing from that of FIG. 16. As shown in FIG. 17, in the example therein, the source line drivers 40 and the well drivers 50 are arranged contrary to FIG. 16. That is, the well driver 50 is arranged at the center part along the first direction in the row decoder 30-1. In contrast, the source line driver 40 is arranged so as to sandwich the well driver 50 in the first direction. That is, the source line drivers 40 and the well drivers 50 are arranged so that two source line drivers 40 face each other through the intervention of the well drivers 50 in the first direction.

As mentioned above, providing the source line drivers 40 and the well drivers 50 in the same row decoder 30 like the configuration according to the embodiment gives the effects of (2) to (4) which have been described for the second embodiment. Especially, this configuration has an effect in a configuration to provide the row decoder 30 only on one side of the memory cell array 10. That is, when the row decoder 30 is disposed only on one side of the memory cell array 10, there is almost no space to arrange the well drivers 50, the source line drivers 40, the power source lines, or the like at the edge part of the memory cell array 10. Therefore, providing the source line drivers 40 and the well drivers 50 in the row decoder 30 allows arranging them near by the pads 80-1 and 80-2, and further allows securing the space to provide the power source lines therein.

As given above, according to the semiconductor memory device of the first to the third embodiments of the invention, the source line drivers 40 is disposed in the row decoder 30. Thereby, the semiconductor memory device may improve the drive ability of the source line drivers 40 of the semiconductor memory device is improved. Even if the layout of the sense amplifier 20 and the row decoder 30 are changed, the VSS wiring may be connected to the plurality of pads 80-1 and 80-2. That is, the source line drivers 40 being ideally arranged regardless the chip layout; the drive ability of the source line driver 40 in the semiconductor memory device is enhanced while suppressing the increase in chip size. Further, arranging the well drivers 50 in the row decoder 30 has a similar effect on the well driver 50.

Figure 18:
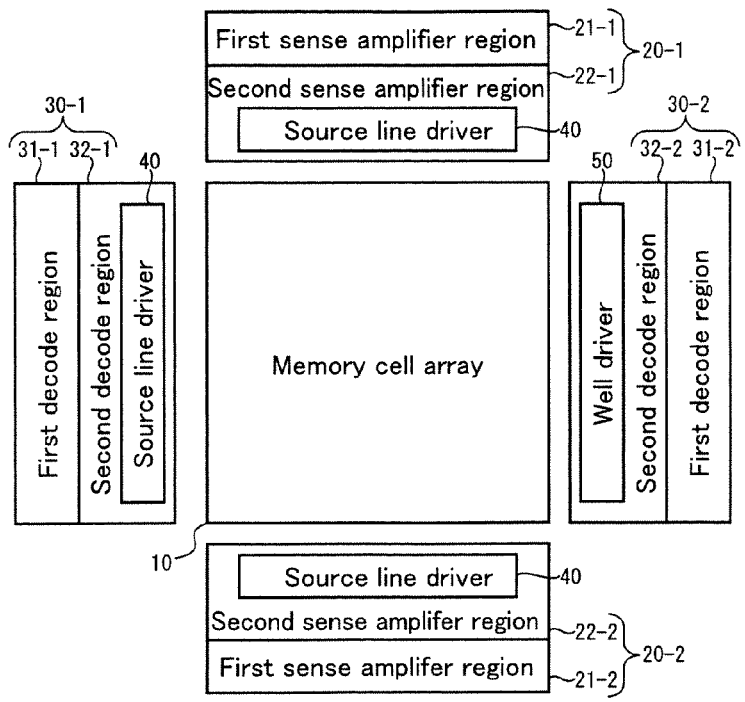
FIG. 18 is a plane view of a flash memory according to a first modified example of the first to the third embodiments of the embodiment.
Figure 19:
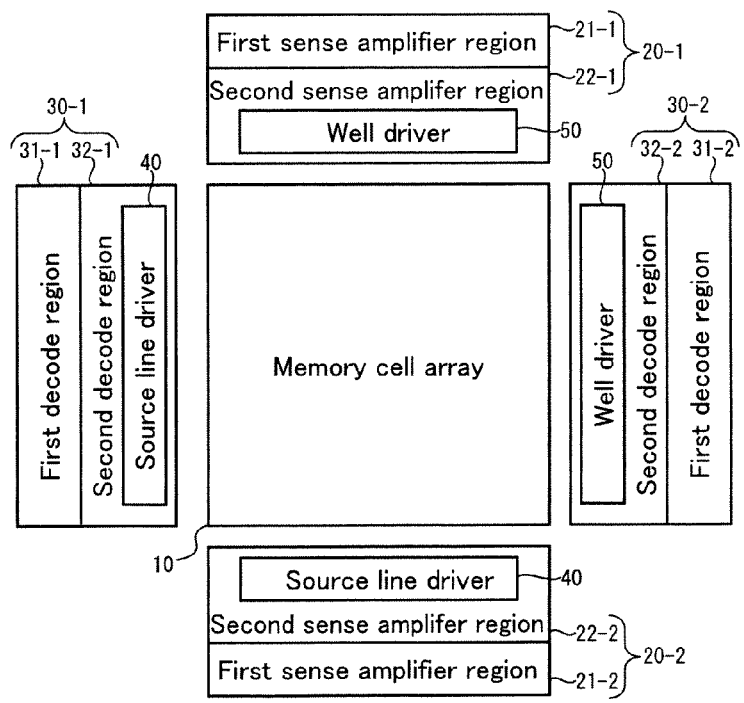
FIG. 19 is a plane view of a flash memory according to a second modified example of the first to the third embodiments of the invention.

The way of arranging the source line driver 40 and the well driver 50 is not limited to the way described in any one of the first to the third embodiments; at least either the source line driver 40 or the well driver 50 may be disposed in the row decoder 30. Referring to FIGS. 18 and 19, there is shown one example of another way of an arrangement. FIGS. 18 and 19 are block diagrams depicting the plane arrangements of the memory cell arrays 10, the sense amplifiers 20, the row decoders 30, source line drivers 40, and the well drivers 50. For example, as illustrated in FIG. 15, the source line drivers 40 may be disposed in the row decoder 30-1, and sense amplifiers 20-1 and 20-2, and the well driver 50 may be disposed in the row decoder 30-2. As shown in FIG. 19, the source line drivers 40 may be disposed in the row decoder 30-1 and the sense amplifier 20-2, and the well driver 50 is disposed in the row decoder 30-2 and the sense amplifier 20-1.

Having described the example to arrange the source line drivers 40 and the well drivers 50 in the second decode region 32 that is the high voltage region in the row decoder 30 in each aforementioned embodiment, so far as the source line drivers 40 and the well drivers 50 are positioned in the row decoder 30, they may be disposed, for example, in the first decode region 31 that is a low voltage region.

Figure 20:
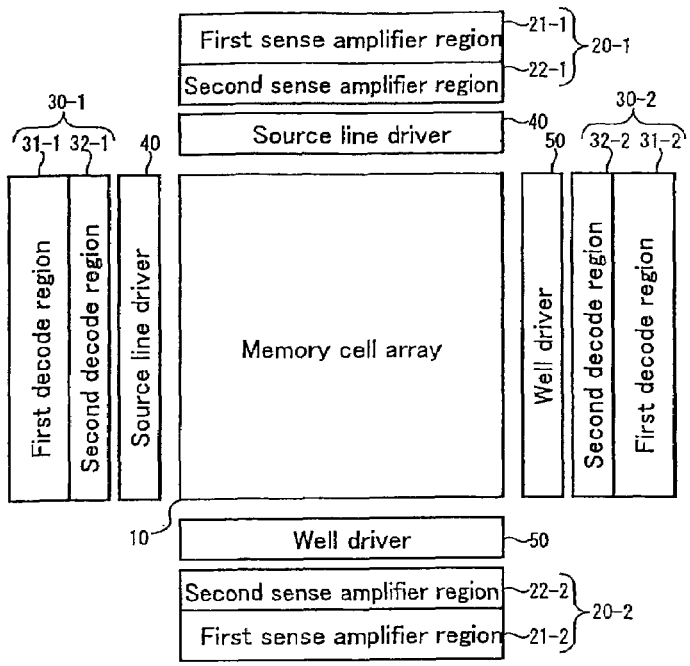
FIG. 20 is a plane view of the flash memory according to the first to the third embodiments of the invention.

Further, each embodiment given above has described that the source line drivers 40 and the well drivers 50 should be arranged in the row decoder 30; however, for instance, in the case in which the source line drivers 40 and the well drivers 50 are arranged at the closest to the memory cell array 10 in the second decode region 32, there is no need to be always arranged in the row decoder 30. Such a case will be described with reference to FIG. 20. FIG. 20 is a block diagram showing the plane arrangement of the memory cell array 10, the sense amplifiers 20, the row decoders 30, the source line drivers 40, and the well drivers 50. As shown in the figure, it is possible to paraphrase that the embodiment arranges the source line driver 40 and the well driver 50 between the memory cell array 10 and the second decode region 32. The same goes for the source line driver 40 and the well driver 50 disposed in the sense amplifier 20. That is, it is possible to paraphrase that the source line driver 40 and the well driver 50 are arranged between the memory cell array 10 and the second sense amplifier 22.

Figure 21:
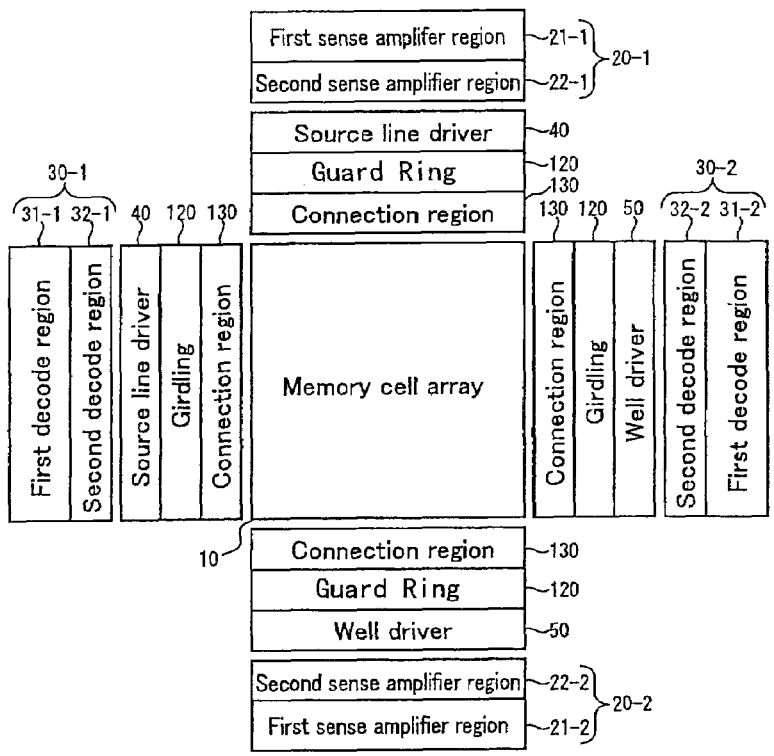
FIG. 21 is a plane view of the flash memory according to the first to the third embodiments of the invention.

The same goes for the guard ring 120 and the connection region 130. FIG. 21 is a block diagram depicting the plane arrangement of the memory cell array 10, the sense amplifiers 20, the row decoders 30, the source line drivers 40, and the well drivers 50, the connection regions 130, and the guard ring 120. As depicted in the figure, in the aforementioned embodiment, it is acceptable to paraphrase that the source line driver 40, the well driver 50, the connection regions 130, and the guard ring 120 are disposed between the memory cell array 10 and the second decode regions 32. Of course, the same goes for the source line driver 40, the well driver 50, the connection regions 130, and the guard ring 120 which are disposed in the sense amplifier 20.

Figure 22:
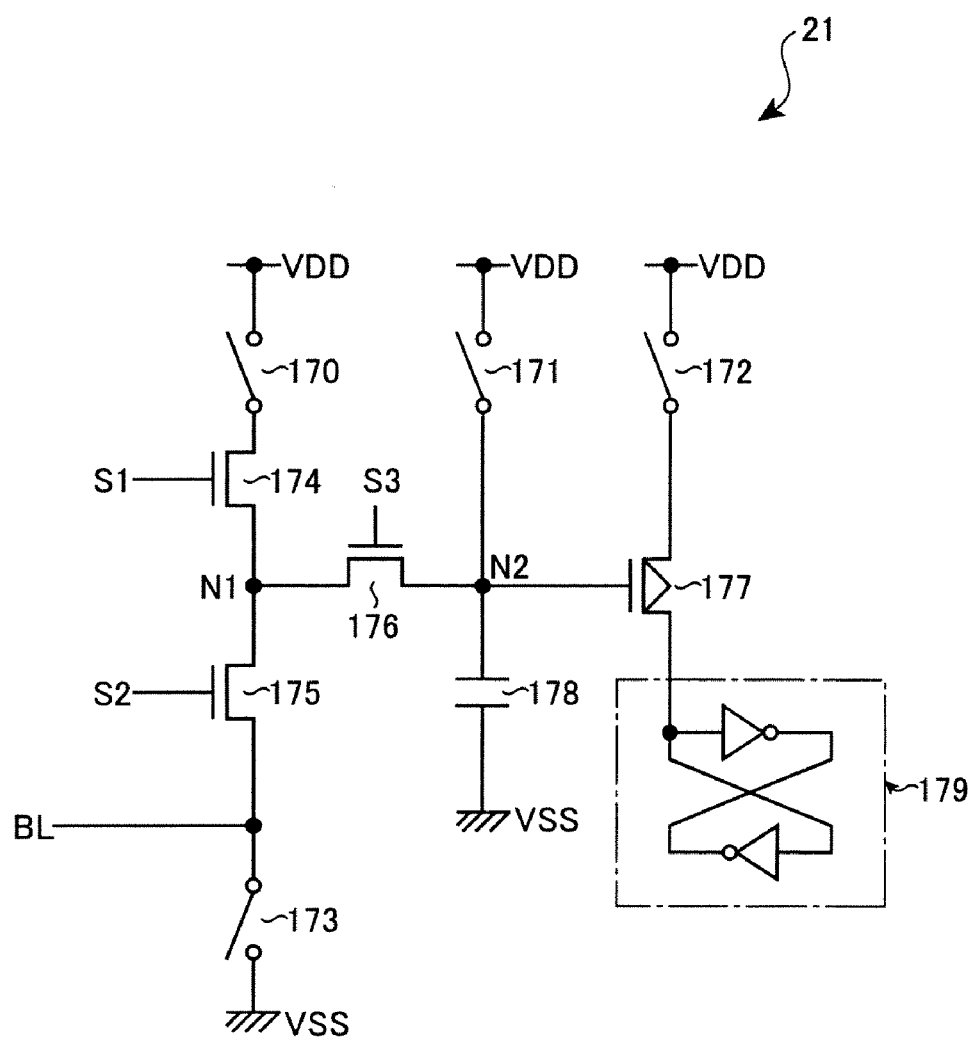
FIG. 22 is a circuit diagram of a sense amplifier provided in the flash memory according to the first to the third embodiment of the invention.

FIG. 22 is a circuit diagram illustrating a configuration example of the first sense amplifier region 21 of the sense amplifier 20 used in the forgoing embodiment. The first sense amplifier region 21 includes, as shown in the figure, switching elements 170-173, n-channel MOS transistors 174-176, p-channel MOS transistor 177, a capacitor element 178, and a latch circuit 179. A voltage VDD is applied, as shown in the figure, to one end of a current path of the MOS transistor through the switching element 170, the other end is connected to a node N1, and a signal S1 is input to its gate. One end of the current path of the MOS transistor 175 is connected to the node N1, the other end is connected to a bit line BL, and is applied a voltage VSS through the switch element 173, and a signal S2 is input to its gate. One end of a current path of the MOS transistor 176 is connected to the node N1, the other end is connected to a node N2, and a signal S3 is input to its gate. The voltage VDD is applied to the node N2 thorough the switch element 171. One electrode of the capacitor element 178 is connected to the node N2, and the voltage VSS is applied to the other electrode thereof. The voltage VDD is applied to one end of the MOS transistor 177 through the switch element 172, the other end is connected to the latch circuit 179, and its gate is connected to the node N2.

A sense method of data according to the given configuration will be described in brief. The case in which "1" data is stored in a selected memory cell will be firstly described. At first, the switch element 170, the MOS transistors 174, 175 and 176 are turned on, the bit line BL is pre-charged at an extent of around 0.65 V, the electrical potentials of the nodes N1 and N2 are pre-charged at extents of around 0.9 V and 2.5 V, respectively. That is, the memory cell being in an on state, each node N1 and N2 is pre-charged while supplying a current on the bit line BL.

After this, the switch element 171 is turned off. The node N2 is then discharged by the current flowing from the node N2 to the bit line BL, the electrical potential of the node N2 becomes around 0.9 V. The electrical potential of the node N1 becomes 0.9 V or lower by the current flowing through the bit line BL; however, feeding an electric current from the MOS transistor 174 maintains the electrical potential of the node N1 at 0.9 V.

The electrical potential at the node N2 being 0.9 V, the MOS transistor 177 turns on. Therefore, the latch circuit 179 holds the voltage VDD. The latch circuit 179 holding the voltage VDD brings the switch element 170 into an off state and brings the switch element 173 into an on state, and it makes the electrical potential of the node N2 be 0 V. As a result, the latch circuit 179 keeps up holding the voltage VDD.

The case in which the selected memory cell holds "0" data will be described below. In this case, the electric potential of the node N2 maintains around 2.5 V. Therefore, the MOS transistor 177 turns off, and the latch circuit 179 keeps the voltage VSS (0 V). Thereby, the switch element 170 turns on, the switch element 173 turns off, the nods N2 maintains its electric potential as 2.5 V, and the latch circuit 179 continuously holds the voltage VSS.

As mentioned above, in the case of the sense amplifier to sense the current through the bit line, it is important to ensure the current quantity to be supplies on the source line. Therefore, employing the aforementioned embodiments capable of improving the abilities of the source line drivers 40 gives a remarkable effect.

The foregoing embodiments having described the NAND-type flash memories as examples, the embodiments are not limited to the NAND-type flash memory, and the embodiments may be applied to a variety of types of semiconductor memories, from the flash memories down.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cell units in which a plurality of memory cells are connected in series, the memory cells including a charge accumulation layer and a control gate formed on the charge accumulation layer;
   a memory cell array in which the memory cell units are disposed;
   a word line which is connected to the control gates of the memory cells;
   a bit line which is electrically connected to drains of the memory cells positioned on one end sides of the memory cell units;
   a source line which is electrically connected to sources of the memory cells positioned on the other end sides of the memory cell units;

a sense amplifier which amplifies data read from the memory cell onto the bit line;

a row decoder which selects the word line; and a source line driver circuit which is arranged in the row decoder and applies a first voltage to the source line, the source line driver being controlled by control signals independent of control of the row decoder.

2. The device according to claim 1, wherein the first voltage is a ground level.

3. The device according to claim 1, wherein the row decoder includes a first decode region in which a first MOS transistor is arranged, the first MOS transistor operating by using a second voltage as a power source voltage; and a second decode region in which a second MOS transistor is arranged, the second MOS transistor operating by using a third voltage higher than the second voltage as a power source voltage, the source line driver circuit being arranged in the second decode region.

4. The device according to claim 1, further comprising a power source pad, which is arranged so as to face the memory cell array with the row decoder interposed therebetween, and to which the first voltage is externally applied, wherein the source line driver circuit is electrically connected to the power source pad, and is applied the first voltage from the power source pad.

5. The device according to claim 1, wherein the source line driver circuit includes a first driver and a second driver, the first driver is arranged in the row decoder, and the second driver is arranged in the sense amplifier.

6. The device according to claim 5, wherein the sense amplifier includes a first sense amplifier region in which a first MOS transistor is arranged, the first MOS transistor operating by using a second voltage as a power source voltage; and a second sense amplifier region in which a second MOS transistor, having a drain or a source receiving a third voltage higher than the second voltage, is arranged, the second driver being arranged in the second sense amplifier region.

7. The device according to claim 1, wherein the sense amplifier includes a latch circuit which is able to hold either "0" data or "1" data;

a first MOS transistor which charges the bit line, the first MOS transistor recharging the bit line after the bit line is charged when the latch circuit holds the "0" data;

a second MOS transistor which discharges the bit line, the second MOS transistor discharging the bit line after the bit line is charged when the latch circuit holds the "1" data; and a capacitor element which has one electrode connected to the bit line, the latch circuit holding either the "0" data or the "1" data in response to a potential of the one electrode of the capacitor element.

8. The device according to claim 1, further comprising a well region in which the memory cell array is formed; and a well driver circuit which is arranged in the row decoder and applies a second voltage to the well region.

9. The device according to claim 8, wherein the row decoder includes a first row decoder and a second row decoder which face each other so as to sandwich the memory cell array, the source line driver circuit is arranged in the first row decoder, and the well driver circuit is arranged in the second row decoder.

10. The device according to claim 8, wherein the source line driver circuit and the well driver circuit are arranged in a direction along the bit line in the row decoder.

11. A semiconductor memory device comprising:

a well region which is formed in a surface of a semiconductor substrate;

memory cell units which is formed on the well region and in which a plurality of memory cells are connected in series, the memory cells including a charge accumulation layer and a control gate formed on the charge accumulation layer;

a memory cell array in which the memory cell units are disposed;

a word line which is connected to the control gates of the memory cells;

a bit line which is electrically connected to drains of the memory cells positioned on one end sides of the memory cell units;

a source line which is electrically connected to sources of the memory cells positioned on the other end sides of the memory cell units;

a sense amplifier which amplifies data read from the memory cell onto the bit line;

a row decoder which selects the word line;

a source line driver circuit which applies a first voltage to the source line; and a well driver circuit which is arranged in the row decoder and applies the first voltage to the source line.

12. The device according to claim 11, wherein the row decoder includes a first decode region in which a first MOS transistor is arranged, the first MOS transistor operating by using a second voltage as a power source voltage; and a second decode region in which a second MOS transistor is arranged, the second MOS transistor operating by using a third voltage higher than the second voltage as a power source voltage, the well driver circuit being arranged in the second decode region.

13. The device according to claim 11, wherein the first voltage is a ground level.

14. The device according to claim 11, wherein the source line driver circuit is arranged in the row decoder.

15. The device according to claim 14, wherein the row decoder includes a first row decoder and a second low decoder which face each other so as to sandwich the memory cell array, the source line driver circuit is arranged in the first row decoder, and the well driver circuit is arranged in the second row decoder.

16. The device according to claim 14, further comprising a power source pad which is arranged so as to face the memory cell array with the row decoder interposed therebetween and to which the first voltage is externally applied, wherein the source line driver circuit is electrically connected to the power source pad, and is applied the first voltage from the power source pad.

17. The device according to claim 14, wherein the source line driver circuit includes a first driver and a second driver, the first driver is arranged in the row decoder, and the second driver is arranged in the sense amplifier.

18. The device according to claim 17, wherein the sense amplifier includes a first sense amplifier region in which a first MOS transistor is arranged, the first MOS transistor operating by using a second voltage as a power source voltage; and a second sense amplifier region in which a second MOS transistor, having a drain or a source receiving a third voltage higher than the second voltage, is arranged, the second river being arranged in the second sense amplifier region.

19. The device according to claim 11, wherein the sense amplifier includes a latch circuit which is able to hold either "0" data or "1" data;

a first MOS transistor which charges the bit line, the first MOS transistor recharging the bit line after the bit line is charged when the latch circuit holds the "0" data;

a second MOS transistor which discharges the bit line, the second MOS transistor discharging the bit line after the bit line is charged when the latch circuit holds the "1" data; and a capacitor element which has one electrode connected to the bit line, the latch circuit holding either the "0" data or the "1" data in response to a potential of the one electrode of the capacitor element.

20. The device according to claim 14, wherein the source line driver circuit and the well driver circuit are arranged in a direction along the bit line in the row decoder.

21. The device according to claim 11, wherein the source line driver is controlled by control signals independent of control of the row decoder.

22. A semiconductor memory device comprising:

memory cell units in which a plurality of memory cells are connected in series, the memory cells including a charge accumulation layer and a control gate formed on the charge accumulation layer;

a memory cell array in which the memory cell units are disposed;

a word line which is connected to the control gates of the memory cells;

a bit line which is electrically connected to drains of the memory cells positioned on one end sides of the memory cell units;

a source line which is electrically connected to sources of the memory cells positioned on the other end sides of the memory cell units;

a sense amplifier which amplifies data read from the memory cell onto the bit line;

a row decoder which selects the word line; and a source line driver circuit which is arranged in the row decoder and applies a first voltage to the source line, wherein the sense amplifier includes a latch circuit which is able to hold either "0" data or "1" data;

a first MOS transistor which charges the bit line, the first MOS transistor recharging the bit line after the bit line is charged when the latch circuit holds the "0" data;

a second MOS transistor which discharges the bit line, the second MOS transistor discharging the bit line after the bit line is charged when the latch circuit holds the "1" data; and a capacitor element which has one electrode connected to the bit line, the latch circuit holding either the "0" data or the "1" data in response to a potential of the one electrode of the capacitor element.

23. The device according to claim 22, wherein the first voltage is a ground level.

24. The device according to claim 22, wherein
the row decoder includes a first decode region in which a third MOS transistor is arranged, the third MOS transistor operating by using a second voltage as a power source voltage; and a second decode region in which a fourth MOS transistor is arranged, the fourth MOS transistor operating by using a third voltage higher than the second voltage as a power source voltage, the source line driver circuit being arranged in the second decode region.

25. The device according to claim 22, further comprising a power source pad, which is arranged so as to face the memory cell array with the row decoder interposed therebetween, and to which the first voltage is externally applied, wherein the source line driver circuit is electrically connected to the power source pad, and is applied the first voltage from the power source pad.

26. The device according to claim 22, wherein the source line driver circuit includes a first driver and a second driver, the first driver is arranged in the row decoder, and the second driver is arranged in the sense amplifier.

27. The device according to claim 26, wherein the sense amplifier includes a first sense amplifier region in which a third MOS transistor is arranged, the third MOS transistor operating by using a second voltage as a power source voltage; and a second sense amplifier region in which a fourth MOS transistor, having a drain or a source receiving a third voltage higher than the second voltage, is arranged, the second driver being arranged in the second sense amplifier region.

28. The device according to claim 22, further comprising
a well region in which the memory cell array is formed; and a well driver circuit which is arranged in the row decoder and applies a second voltage to the well region.

29. The device according to claim 28, wherein the row decoder includes a first row decoder and a second row decoder which face each other so as to sandwich the memory cell array, the source line driver circuit is arranged in the first row decoder, and the well driver circuit is arranged in the second row decoder.

30. The device according to claim 29, wherein the source line driver circuit and the well driver circuit are arranged in a direction along the bit line in the row decoder.

* * * * *

UNITED STATES PATENT AND TRADEMARK OFFICE
CERTIFICATE OF CORRECTION

PATENT NO.         : 7,518,921 B2
APPLICATION NO.    : 11/688481
DATED              : April 14, 2009
INVENTOR(S)        : Maejima et al.

Page 1 of 1

It is certified that error appears in the above-identified patent and that said Letters Patent is hereby corrected as shown below:

On the title page, Item (73), the Assignee information is incorrect. Item (73) should read:

-- (73) Assignee: Kabushiki Kaisha Toshiba, Tokyo (JP) --

Signed and Sealed this

Sixteenth Day of June, 2009

JOHN DOLL
*Acting Director of the United States Patent and Trademark Office*